United States Patent
More et al.

(10) Patent No.: US 9,847,334 B1
(45) Date of Patent: Dec. 19, 2017

(54) STRUCTURE AND FORMATION METHOD OF SEMICONDUCTOR DEVICE WITH CHANNEL LAYER

(71) Applicant: Taiwan Semiconductor Manufacturing Co., Ltd., Hsinchu (TW)

(72) Inventors: Shahaji B. More, Hsinchu (TW); Zheng-Yang Pan, Zhubei (TW); Tsung-Lin Lee, Hsinchu (TW); Shih-Chieh Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/356,252

(22) Filed: Nov. 18, 2016

(51) Int. Cl.
*H01L 27/092* (2006.01)
*H01L 21/8238* (2006.01)
*H01L 29/165* (2006.01)
*H01L 21/324* (2006.01)

(52) U.S. Cl.
CPC ........ *H01L 27/0924* (2013.01); *H01L 21/324* (2013.01); *H01L 21/823807* (2013.01); *H01L 21/823821* (2013.01); *H01L 27/0928* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 7,425,740 B2 | 9/2008 | Liu et al. |
| 7,432,171 B2 | 10/2008 | Casady et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |

(Continued)

OTHER PUBLICATIONS

U.S. Office Action for U.S. Appl. No. 15/356,004, dated Jun. 29, 2017.

*Primary Examiner* — Reema Patel
(74) *Attorney, Agent, or Firm* — Birch, Stewart, Kolasch & Birch, LLP

(57) ABSTRACT

Structures and formation methods of a semiconductor device are provided. The semiconductor device includes a semiconductor substrate with a first lattice constant and having a PMOS region and an NMOS region. The semiconductor device further includes first and second fin structures over the PMOS region and NMOS region respectively. The first fin structure includes a buffer layer with a second lattice constant and a first channel layer. The lattice constant difference between the first channel layer and the buffer layer is smaller than that between the first channel layer and the semiconductor layer. The first channel layer has a third lattice constant, which is greater than the second lattice constant. The first lattice constant is greater than the second lattice constant. The second fin structure includes a second channel layer. The second channel layer has a fourth lattice constant which is less than the first lattice constant.

20 Claims, 13 Drawing Sheets

(56) References Cited

U.S. PATENT DOCUMENTS

| | | |
|---|---|---|
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2003/0052348 A1 | 3/2003 | Takagi et al. |
| 2006/0148220 A1 | 7/2006 | Lindert et al. |
| 2008/0116487 A1 | 5/2008 | Lee et al. |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0263003 A1 | 9/2015 | Lee et al. |
| 2015/0311341 A1* | 10/2015 | Hur .................. H01L 21/02532 257/190 |
| 2016/0133747 A1 | 5/2016 | Murthy et al. |

* cited by examiner

STRUCTURE AND FORMATION METHOD OF SEMICONDUCTOR DEVICE WITH CHANNEL LAYER

CROSS REFERENCE TO RELATED APPLICATIONS

This application is related to the following co-pending and commonly assigned patent application: U.S. patent application Ser. No. 15/356,004, filed on Nov. 18, 2016, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
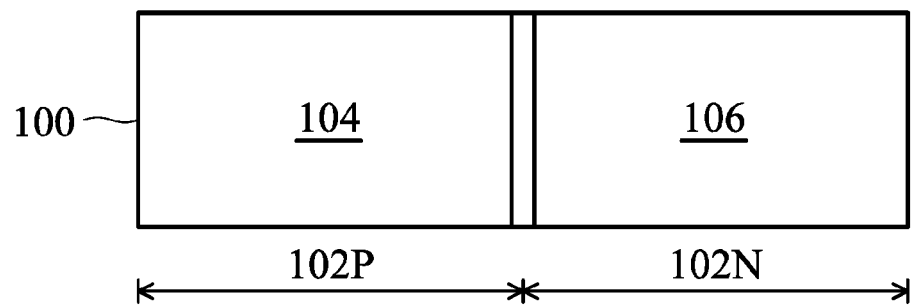
FIGS. 1A-1G are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a semiconductor device, in accordance with some embodiments. As shown in FIG. 1A, a semiconductor substrate 100 is received or provided, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the semiconductor substrate 100 has a P-type metal-oxide-semiconductor region 102P (PMOS region 102P) and an N-type metal-oxide-semiconductor region 102N (NMOS region 102N) adjacent to the PMOS region 102P, in accordance with some embodiments. In some embodiments of the present disclosure, the PMOS region 102P is used to form a PMOS structure therein, whereas the NMOS region 102N is used to form an NMOS structure therein.

In some embodiments, an N-well region 104 and a P-well region 106 are formed sequentially in the semiconductor substrate 100, as shown in FIG. 1A. As shown in FIG. 1A, the N-well region 104 is formed in the semiconductor substrate 100 in the PMOS region 102P, whereas the P-well region 106 is formed in the semiconductor substrate 100 in the NMOS region 102N, in accordance with some embodiments. As shown in FIG. 1A, the N-well region 104 and the P-well region 106 are separated from each other, in accordance with some embodiments.

In some embodiments, separate ion implantation processes are performed to form the P-well region 106 and the N-well region 104, respectively. By using two different implantation mask layers, the P-well region 106 and the N-well region 104 are sequentially formed in different ion implantation processes.

In some embodiments, a first implantation mask layer (not shown) is used to cover a portion of the semiconductor substrate 100 in the PMOS region 102P. The first implantation mask layer has an opening which exposes another portion of the semiconductor substrate 100 in the NMOS region 102N. In some embodiments, the first implantation mask layer is a patterned photoresist layer. In some other embodiments, the first implantation mask layer is a patterned dielectric layer, such as a silicon nitride layer. Afterwards, a first ion implantation process is performed on the exposed portion of the semiconductor substrate 100 in the NMOS region 102N to form a well region such as the P-well region 106. For example, P-type dopants such as boron or $BF_2$ are implanted into the exposed portion of the semiconductor substrate 100 to form the P-well region 106. The first implantation mask layer is then removed.

Afterwards, a second implantation mask layer (not shown) is used to cover the P-well region 106 in some embodiments. The second implantation mask layer has an opening which exposes the portion of the semiconductor substrate 100 in the PMOS region 102P previously covered by the first implantation mask layer. In some embodiments, the second implantation mask layer is a patterned photoresist layer. In some other embodiments, the second implantation mask layer is a patterned dielectric layer, such as a silicon nitride layer. Afterwards, a second ion implantation process is performed to form a well region such as the N-well region 104. For example, N-type dopants such as phosphor or arsenic are implanted into the exposed portion of the semiconductor substrate 100 in the PMOS region 102P to form the N-well region 104.

Afterwards, an annealing process is performed to drive in the implanted dopants in some embodiments. In some other embodiments, the N-well region 104 is formed before the P-well region 106. In some other embodiments, the P-well region is not formed if the semiconductor substrate 100 is a P-type semiconductor substrate. In some other embodiments, the N-well region is not formed if the semiconductor substrate 100 is an N-type semiconductor substrate.

Afterward, a semiconductor material layer 108 is deposited over the semiconductor substrate 100. In some embodiments of the present disclosure, the semiconductor material layer 108 is substantially made of silicon. In some other embodiments, the semiconductor material layer 108 is substantially made of Ge, Si/Ge, III-V compound, or a combination thereof.

In some embodiments of the present disclosure, the semiconductor material layer 108 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments of the present disclosure, the semiconductor material layer 108 is an un-doped semiconductor material layer.

Figure 1B:
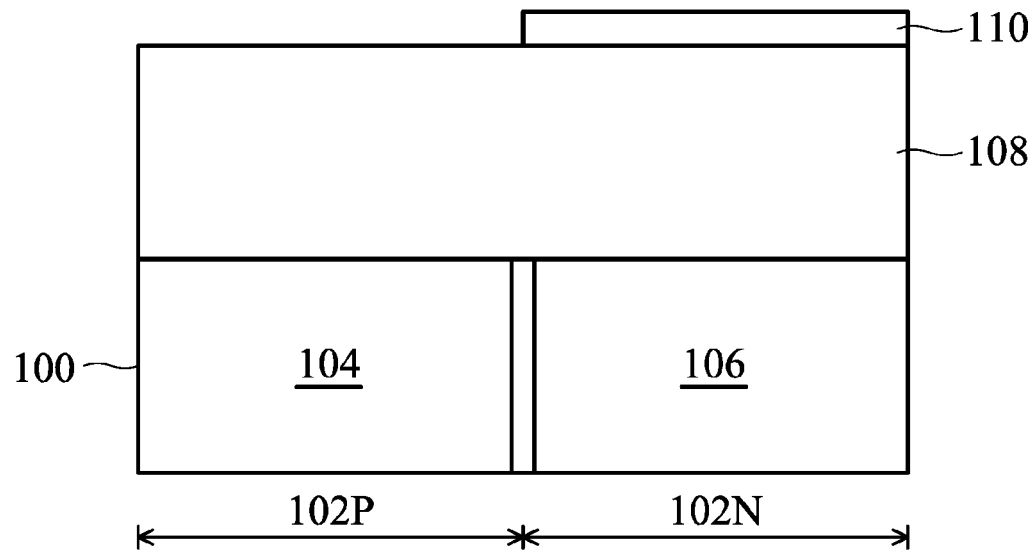

As shown in FIG. 1B, a mask layer 110 is formed over the semiconductor material layer 108, in accordance with some embodiments. As shown in FIG. 1B, the mask layer 110 covers the portion of the semiconductor material layer 108 in the NMOS region 102N, in accordance with some embodiments. The mask layer 110 has an opening which exposes another portion of the semiconductor material layer 108 in the PMOS region 102P. In some embodiments, the mask layer 110 is a patterned photoresist layer. In some other embodiments, the mask layer 110 is a patterned dielectric layer such as a silicon oxide, silicon nitride, silicon oxynitride, another suitable dielectric material, or a combination thereof.

Figure 1C:
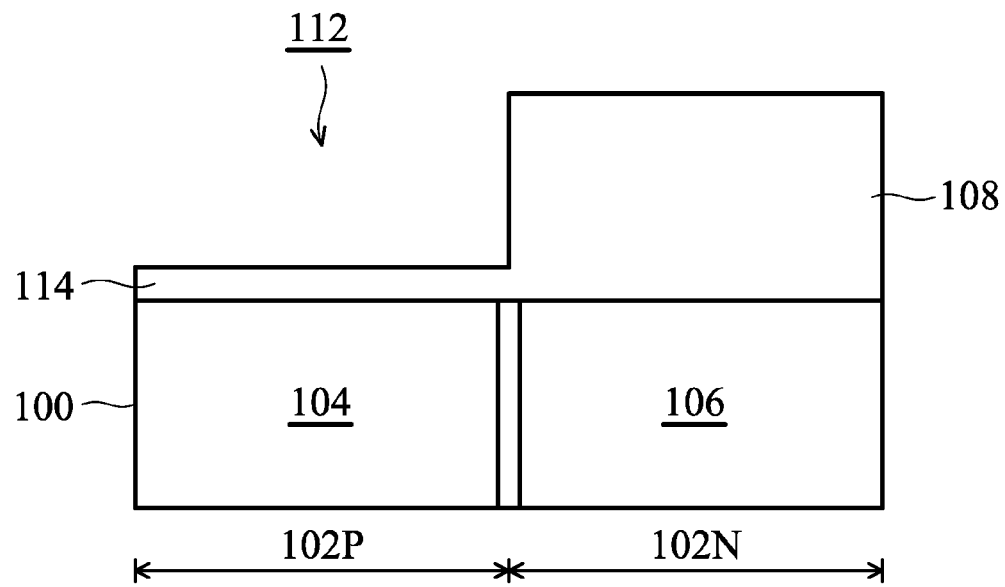

As shown in FIG. 1C, the portion of the semiconductor material layer 108 in the PMOS region 102P, which is exposed by the mask layer 110, is partially removed to form a recess 112 in the PMOS region 102P, in accordance with some embodiments.

As shown in FIG. 1C, the remaining portion of the semiconductor material layer 108 in the PMOS region 102P forms the semiconductor layer 114, in accordance with some embodiments. In some embodiments of the present disclosure, the semiconductor layer 114 is substantially made of silicon. In addition, in some embodiments of the present disclosure, the remaining portion of the semiconductor material layer 108 in the NMOS region 102N serves as a channel layer of the subsequently formed NMOS structure.

In some embodiments of the present disclosure, the portion of the semiconductor material layer 108 in the PMOS region 102P is partially removed using an etching process. In some embodiments of the present disclosure, the etching process may include a wet etching process, a dry etching process, or a combination thereof. As shown in FIG. 1C, after the portion of the semiconductor material layer 108 in the PMOS region 102P is partially removed, the mask layer 110 is removed, in accordance with some embodiments.

Figure 1D:
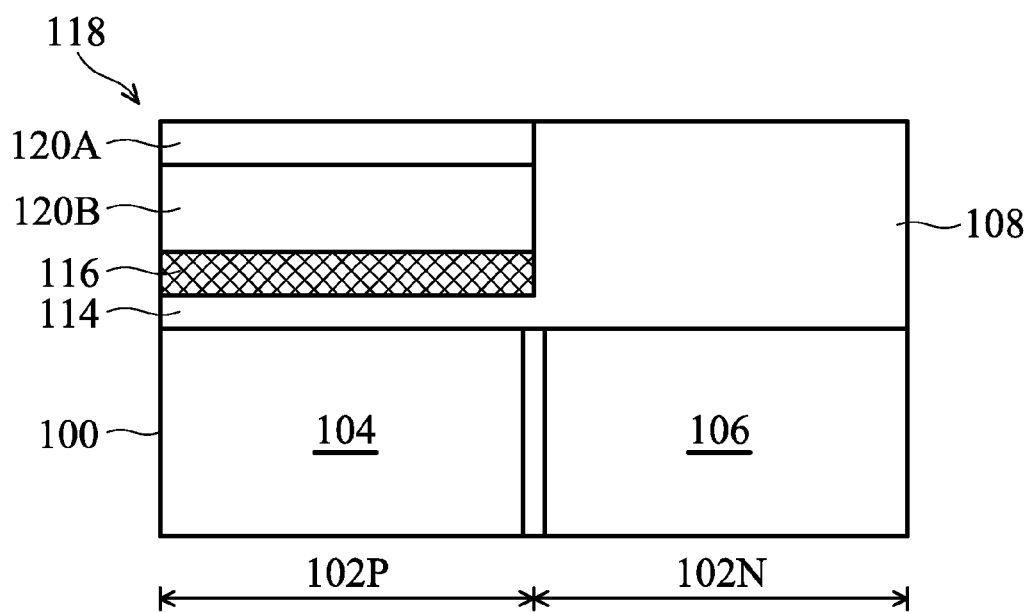

As shown in FIG. 1D, a first buffer material layer 116 is formed over the top surface of the semiconductor layer 114 and formed in the recess 112, in accordance with some embodiments. In some embodiments, the first buffer material layer 116 is a silicon carbide buffer layer. The first buffer material layer 116 may include epitaxially grown silicon carbide (SiC), or another suitable epitaxially grown buffer material. In some embodiments of the present disclosure, the first buffer material layer 116 has an atomic concentration of carbon in a range from about 0.5 atom % to about 10 atom %, for example from about 2 atom % to about 5 atom %.

In some embodiments of the present disclosure, the top surface of the first buffer material layer 116 is lower than the top surface of the semiconductor material layer 108 in the NMOS region 102N. In some embodiments of the present disclosure, the thickness of the first buffer material layer 116 from the top surface of the semiconductor layer 114 to the top surface of the first buffer material layer 116 is in a range from about 3 nm to about 10 nm, for example from about 5 nm to about 7 nm.

In some embodiments, a silicon carbide is epitaxially grown in the recess 112 to form the first buffer material layer 116. In particular, in some embodiments, the first buffer material layer 116 is formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the first buffer material layer 116 may use gaseous and/or liquid precursors.

In some embodiments, in the formation process of the first buffer material layer 116, the operation temperature is in a range from about 400° C. to about 800° C., for example about 550° C. to about 650° C., and the operation pressure is in a range from about 1 torr to about 200 torr, for example about 50 torr to about 100 torr. In some embodiments of the present disclosure, the precursor for carbon is methylsilane, and the precursor for silicon is dichlorosilane or silane (silicon tetrahydride). In some embodiments of the present disclosure, a hydrogen gas or a nitrogen gas is used as a gas carrier.

In some embodiments, the first buffer material layer 116 is doped with one or more suitable dopants. For example, the first buffer material layer 116 is a Si liner layer doped with carbon (C) or another suitable dopant. In some embodiments, the first buffer material layer 116 is doped in-situ during the growth of the first buffer material layer 116.

As shown in FIG. 1D, a channel layer 118 is formed over the first buffer material layer 116 in the recess 112, in accordance with some embodiments. In some embodiments of the present disclosure, the channel layer 118 is a silicon germanium channel layer. In other words, in some embodiments, the channel layer 118 includes silicon (also referred as a first element) and germanium (also referred as a second element), and the atomic mass of the germanium is greater than the atomic mass of the silicon. In some embodiments of the present disclosure, the channel layer 118 serves as a channel layer for the subsequently formed PMOS structure.

As shown in FIG. 1D, the channel layer 118 includes at least two portions with different germanium concentrations, in accordance with some embodiments. For example, the channel layer 118 has a first portion 120A and a second portion 120B between the first portion 120A and the first buffer material layer 116 or the subsequently formed second buffer material layer as shown in FIG. 1D in accordance with some embodiments. In some embodiments of the present disclosure, the first portion 120A has an atomic concentration of germanium greater than that of the second portion 120B.

As shown in FIG. 1D, the second portion 120B partially fills in the recess 112. In some embodiments of the present disclosure, the top surface of the second portion 120B is below the top surface of the semiconductor material layer 108 in the NMOS region 102N, in accordance with some embodiments.

In addition, as shown in FIG. 1D, the first portion 120A fills in the recess 112, and the top surface of the first portion 120A is coplanar with the top surface of the semiconductor material layer 108 in the NMOS region 102N, in accordance with some embodiments.

In some embodiments, each of the first portion 120A and the second portion 120B of the channel layer 118 is made of a semiconductor material. In some embodiments, each of the first portion 120A and the second portion 120B of the channel layer 118 may include epitaxially grown silicon germanium.

In particular, in some embodiments, the first portion 120A and the second portion 120B of the channel layer 118 are formed by using a selective epitaxial growth (SEG) process, a molecular beam epitaxy process, a CVD process (e.g., a vapor-phase epitaxy (VPE) process, a low pressure chemical vapor deposition (LPCVD) process, and/or an ultra-high vacuum CVD (UHV-CVD) process) with an optional etching process, another applicable process, or a combination thereof. In some embodiments of the present disclosure, the first portion 120A and the second portion 120B of the channel layer 118 are formed by a cyclic deposition-etch process. In some embodiments of the present disclosure, the formation process of the first portion 120A and the second portion 120B of the channel layer 118 may use gaseous and/or liquid precursors.

In some embodiments, the formation of the channel layer 118 includes at least two different deposition or epitaxial growth operations. In some embodiments, a semiconductor material is formed over the first buffer material layer 116 in the recess 112 to form the second portion 120B of the channel layer 118 using the above-mentioned epitaxial growth process or CVD process. Subsequently, another semiconductor material is formed over the second portion 120B in the recess 112 to form a channel material layer (not shown) using the above-mentioned epitaxial growth process or CVD process. In some embodiments of the present disclosure, the channel material layer covers the second portion 120B in the PMOS region 102P and the semiconductor material layer 108 in the NMOS region 102N.

Afterwards, a planarization process may be used to partially remove the channel material layer. The channel material layer may be partially removed until the top surface of the semiconductor material layer 108 in the NMOS region 102N is exposed. As a result, the first portion 120A of the channel layer 118 is formed. In some embodiments, the planarization process includes a CMP process, a grinding process, a dry polishing process, an etching process, another applicable process, or a combination thereof.

In some embodiments, the first portion 120A and the second portion 120B of the channel layer 118 is formed in the same chamber, and the above-mentioned two different deposition or epitaxial growth operations are performed in the same chamber.

In some embodiments, in the formation process of the channel layer 118, the operation temperature is in a range from about 400° C. to about 800° C., for example about 550° C. to about 650° C., and the operation pressure is in a range from about 1 torr to about 200 torr, for example about 50 torr to about 100 torr. In some embodiments of the present disclosure, the precursor for silicon is dichlorosilane or silane (silicon tetrahydride), and the precursor for germanium is germane ($GeH_4$). In some embodiments of the present disclosure, a hydrogen gas or a nitrogen gas is used as a gas carrier.

In some embodiments of the present disclosure, the first portion 120A and the second portion 120B of the channel layer 118 have different germanium concentrations. In some embodiments, the first portion 120A has an atomic concentration of germanium greater than that of the second portion 120B.

In some embodiments of the present disclosure, the first portion 120A has an atomic concentration of germanium in a range from about 25 atom % to about 60 atom %, for example from about 30 atom % to about 40 atom %. In some embodiments of the present disclosure, the second portion 120B has an atomic concentration of germanium in a range from about 3 atom % to about 20 atom %, for example from about 5 atom % to about 10 atom %.

In some cases, since the second portion 120B, which is closer to the first buffer material layer 116 than the first portion 120A, has an atomic concentration of germanium less than that of the first portion 120A, the lattice constant difference between the second portion 120B and the subsequent buffer layer formed from the first buffer material layer 116 is smaller than the lattice constant difference between the first portion 120A and the subsequent buffer layer. As a result, the lattice constant difference between the channel layer 118 and the subsequent buffer layer is reduced, and the performance of the device is improved. In some embodiments of the present disclosure, the subsequent buffer layer is a silicon germanium carbide buffer layer formed from the first buffer material layer 116.

In some cases, if the germanium concentration of the second portion 120B of the channel layer 118 is too high, for example higher than about 20 atom %, the lattice constant difference between the second portion 120B and the subsequent buffer layer may be too large. However, in some other cases, if the germanium concentration of the second portion 120B of the channel layer 118 is too low, for example lower than about 3 atom %, the second portion 120B of the channel layer 118 may not be able to impart sufficient stress or strain to the channel layer.

In some cases, if the germanium concentration of the first portion 120A of the channel layer 118 is too high, for example higher than about 60 atom %, the lattice constant difference between the first portion 120A and the second portion 120B may be too large. However, in some other cases, if the germanium concentration of the first portion 120A of the channel layer 118 is too low, for example lower than about 25 atom %, the first portion 120A of the channel layer 118 may not be able to impart sufficient stress or strain to the channel layer.

In some embodiments of the present disclosure, the first portion 120A is adjacent to the second portion 120B, and the second portion 120B is thicker than the first portion 120A.

In some embodiments of the present disclosure, the thickness of the first portion 120A from the top surface of the second portion 120B to the top surface of the first portion 120A is in a range from about 3 nm to about 10 nm, for example from about 5 nm to about 7 nm.

In some embodiments of the present disclosure, the thickness of the second portion 120B from the top surface of the first buffer material layer 116 to the top surface of the second portion 120B is in a range from about 5 nm to about 20 nm, for example from about 10 nm to about 15 nm.

In some other embodiments of the present disclosure, the channel layer 118 includes more than two portions with different germanium concentrations. In some embodiments of the present disclosure, the channel layer 118 includes 3-20 portions with different germanium concentrations, for example, 10-15 portions with different germanium concentrations.

In some embodiments, for every two adjacent portions in the channel layer 118, the portion farther away from the first buffer material layer 116 has an atomic concentration of germanium greater than the atomic concentration of germanium of the portion closer to the first buffer material layer 116.

In addition, in some embodiments, for every two adjacent portions in the channel layer 118, the portion farther away from the first buffer material layer 116 has a thickness that is less than the thickness of the portion closer to the first buffer material layer 116.

Figure 1E:
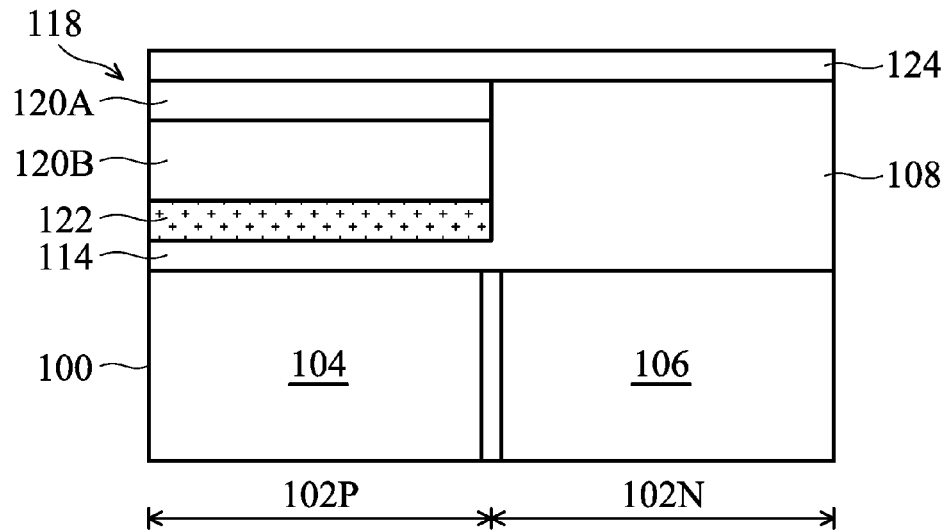

As shown in FIG. 1E, a cap layer 124 is deposited over the channel layer 118 in the PMOS region 102P and over the semiconductor material layer 108 in the N-well region 104, in accordance with some embodiments. In some embodiments of the present disclosure, the cap layer 124 is used to prevent Ge in the channel layer 118 from out-gassing during a thermal process. In some embodiments of the present disclosure, the thickness of the cap layer 124 from the top surface of the first portion 120A to the top surface of the cap layer 124 is in a range from about 2 nm to about 10 nm, for example from about 5 nm to about 6 nm.

In some embodiments of the present disclosure, the cap layer 124 is substantially made of silicon. In some embodiments, the cap layer 124 is deposited using a CVD process, an ALD process, a spin-on process, a spray coating process, another applicable process, or a combination thereof.

After forming the cap layer 124, a thermal process is performed to activate the dopants in the channel layer 118 and the first buffer material layer 116, in accordance with some embodiments. In some embodiments of the present disclosure, the thermal process is an annealing process, such as a rapid thermal annealing process.

As shown in FIG. 1E, a portion of germanium (Ge, referred to as the second element) of the channel layer 118 is diffused into the first buffer material layer 116 to form a second buffer material layer 122 in the thermal process, in accordance with some embodiments. In some embodiments of the present disclosure, the first buffer material layer 116 is a silicon carbide buffer layer, and germanium in the channel layer 118 is diffused into the silicon carbide buffer layer to form the second buffer material layer 122 containing silicon (Si), germanium (Ge), and carbon (C). In other words, in some embodiments of the present disclosure, the channel layer 118 and the second buffer material layer 122 contains the same element, such as silicon (Si) or germanium (Ge), and silicon (Si) or germanium (Ge) has an atomic mass greater than that of carbon (C).

In some embodiments of the present disclosure, the second buffer material layer 122 is a silicon germanium carbide buffer layer formed from the first buffer material layer 116. As shown in FIG. 1E, the first buffer material layer 116 is replaced by the second buffer material layer 122, in accordance with some embodiments. In some embodiments of the present disclosure, the second buffer material layer 122 is also referred to as a carbon-containing buffer layer.

In some embodiments of the present disclosure, the second buffer material layer 122 has an atomic concentration of carbon in a range from about 0.5 atom % to about 5 atom %, for example from about 2 atom % to about 3 atom %.

In some embodiments of the present disclosure, the second buffer material layer 122 has an atomic concentration of germanium in a range from about 3 atom % to about 60 atom %, for example from about 30 atom % to about 40 atom %.

In some embodiments of the present disclosure, the atomic concentration of germanium in the second buffer material layer 122 decreases along a direction from the channel layer 118 towards the semiconductor layer 114 since the germanium in the second buffer material layer 122 comes from the channel layer 118 through a diffusion process. In some embodiments of the present disclosure, the second buffer material layer 122 has the highest germanium concentration at the top surface of the second buffer material layer 122 which is adjacent to the bottom surface of the second portion 120B of the channel layer 118. However, in some other embodiments, the second buffer material layer 122 has a constant atomic concentration of germanium.

In some embodiments of the present disclosure, the thickness of the second buffer material layer 122 from the top surface of the semiconductor layer 114 to the top surface of the second buffer material layer 122 is in a range from about 3 nm to about 10 nm, for example from about 5 nm to about 7 nm.

In some embodiments of the present disclosure, the lattice constant difference between the second portion 120B of the channel layer 118 and the second buffer material layer 122 is smaller than the lattice constant difference between the channel layer 118 and the semiconductor layer 114, thereby reducing the lattice constant difference in the device. In some cases, since the lattice constant difference in the device is reduced, the axial stress in the channel layer is balanced and the performance of the device is improved.

In some embodiments of the present disclosure, the lattice constant difference between the semiconductor layer 114 and the second buffer material layer 122 is smaller than the lattice constant difference between the semiconductor layer 114 and the channel layer 118, thereby reducing the lattice constant difference in the device. In some cases, since the lattice constant difference in the device is reduced, the axial stress in the channel layer is balanced and the performance of the device is improved.

In some embodiments of the present disclosure, the value derived by dividing the lattice constant difference between the second portion 120B of the channel layer 118 and the second buffer material layer 122 by the lattice constant of the second buffer material layer 122 is smaller than 1%, for example, smaller than 0.5%, 0.1% or 0.01%. In some embodiments of the present disclosure, this value is also referred to as the lattice mismatch between the channel layer 118 and the second buffer material layer 122.

In some embodiments of the present disclosure, the value derived by dividing the lattice constant difference between the semiconductor layer 114 and the second buffer material layer 122 by the lattice constant of the second buffer material layer 122 is smaller than 1%, for example, smaller than 0.5%, 0.1% or 0.01%. In some embodiments of the present disclosure, this value is also referred to as the lattice mismatch between the semiconductor layer 114 and the second buffer material layer 122.

Figure 1F:
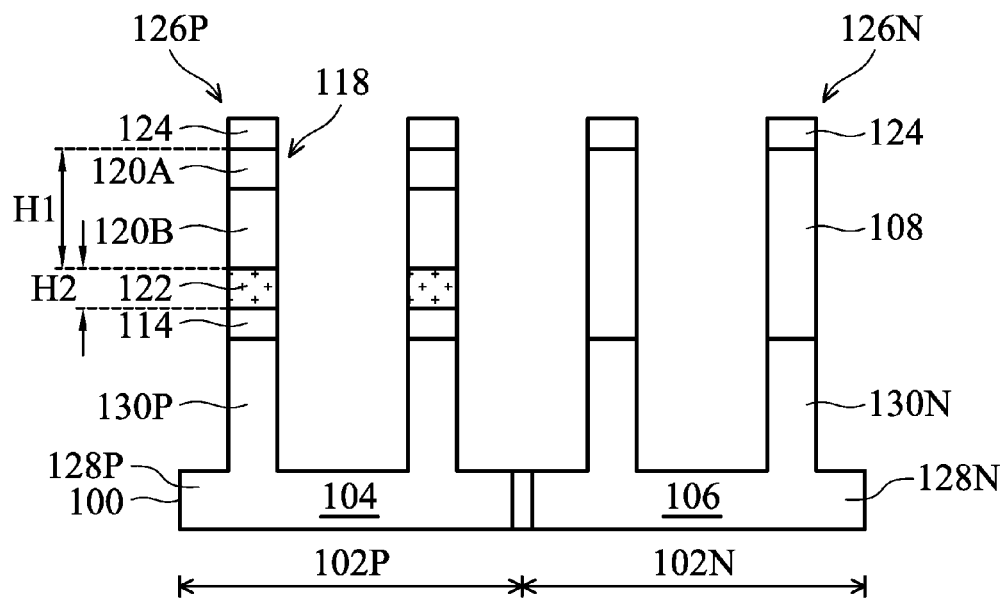

As shown in FIG. 1F, one or more fin structures are formed over the semiconductor substrate 100. As shown in FIG. 1F, fin structures 126P in the PMOS region 102P and fin structures 126N in the NMOS region 102N are formed, in accordance with some embodiments.

In some embodiments, the fin structures 126P are formed by etching into the cap layer 124, the first portion 120A and the second portion 120B of the channel layer 118, the second buffer material layer 122, the semiconductor layer 114 and the semiconductor substrate 100 in the PMOS region 102P.

The cap layer 124, the first portion 120A and the second portion 120B of the channel layer 118, the second buffer material layer 122, the semiconductor layer 114 and the semiconductor substrate 100 in the PMOS region 102P are partially removed to form recesses (or trenches). A photolithography process and an etching process may be used to form the recesses. As a result, the fin structures 126P are formed between the recesses.

As shown in FIG. 1F, the N-well region 104 of the etched semiconductor substrate 100 in the PMOS region 102P includes a base portion 128P and a protrusion portion 130P over the base portion 128P, in accordance with some embodiments. As shown in FIG. 1F, the base portion 128P is wider than the protrusion portion 130P, in accordance with some embodiments. As shown in FIG. 1F, the fin structure 126P includes the protrusion portion 130P of the semiconductor substrate 100 over the base portion 128P, the semiconductor layer 114 over the protrusion portion 130P, the second buffer material layer 122 over the semiconductor layer 114, the channel layer 118 including the first portion 120A and the second portion 120B over the second buffer material layer 122, and the cap layer 124 over the channel layer 118, in accordance with some embodiments.

In some cases, the second buffer material layer 122 may reduce the lattice constant difference between different layers in the fin structure 126P, thereby reducing the uniaxial stress in the fin structure 126P. Therefore, the performance of the device is improved. In some embodiments of the present disclosure, the uniaxial stress in the fin structure 126P is in a range from about 0.5 GPa to about 3 GPa, for example from about 1 GPa to about 2 GPa.

In addition, in some embodiments of the present disclosure, the uniaxial stress in the second buffer material layer 122 is less than or equal to about 0.1 GPa. For example, the uniaxial stress in the second buffer material layer 122 is in a range from about 0.001 GPa to about 0.1 GPa, for example from about 0.005 GPa to about 0.01 GPa.

As shown in FIG. 1F, in some embodiments, the fin structures 126N in the NMOS region 102N are formed by etching into the cap layer 124, the semiconductor material layer 108 and the semiconductor substrate 100 in the NMOS region 102N.

In some embodiments of the present disclosure, the cap layer 124, the semiconductor material layer 108 and the semiconductor substrate 100 in the NMOS region 102N are partially removed to form recesses (or trenches). A photolithography process and an etching process may be used to form the recesses. As a result, the fin structures 126N are formed between the recesses.

As shown in FIG. 1F, the P-well region 106 of the etched semiconductor substrate 100 in the NMOS region 102N includes a base portion 128N and a protrusion portion 130N over the base portion 128N, in accordance with some embodiments. As shown in FIG. 1F, the base portion 128N is wider than the protrusion portion 130N, in accordance with some embodiments. As shown in FIG. 1F, the fin structure 126N includes the protrusion portion 130N of the semiconductor substrate 100 over the base portion 128N, the semiconductor material layer 108 over the protrusion portion 130N, and the cap layer 124 over the semiconductor material layer 108, in accordance with some embodiments.

In some embodiments of the present disclosure, in the PMOS region 102P, the lattice constant of the second portion 120B of the channel layer 118 is greater than the lattice constant of the second buffer material layer 122. In some embodiments of the present disclosure, the lattice constant of the semiconductor substrate 100 is greater than the lattice constant of the second buffer material layer 122. In some embodiments of the present disclosure, the lattice constant of the semiconductor layer 114 is also greater than the lattice constant of the second buffer material layer 122.

In some embodiments of the present disclosure, in the NMOS region 102N, the semiconductor material layer 108 serves as a channel layer 108 of the fin structures 126N. In some embodiments of the present disclosure, the lattice constant of the channel layer 108 is less than the lattice constant of the semiconductor substrate 100.

As shown in FIG. 1F, the channel layer 118 has a first height H1, and the second buffer material layer 122 has a second height H2, in accordance with some embodiments. In some embodiments of the present disclosure, the first height H1 is greater than the second height H2. In some embodiments of the present disclosure, the ratio of the first height H1 to the second height H2 (H1/H2) is in a range from about 3 to about 20, for example, from about 5 to about 10.

Figure 1G:
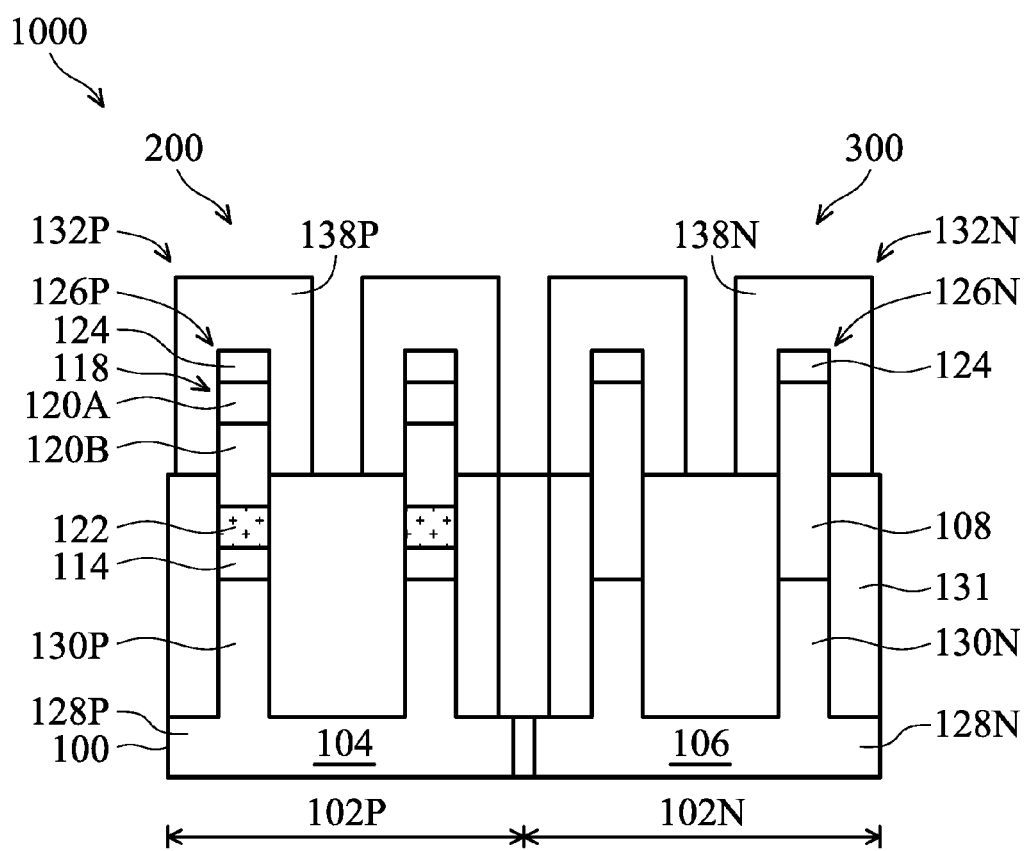

As shown in FIG. 1G, a semiconductor device 1000 including an N-type metal-oxide-semiconductor structure and a P-type metal-oxide-semiconductor structure is formed, in accordance with some embodiments.

Figure 2:
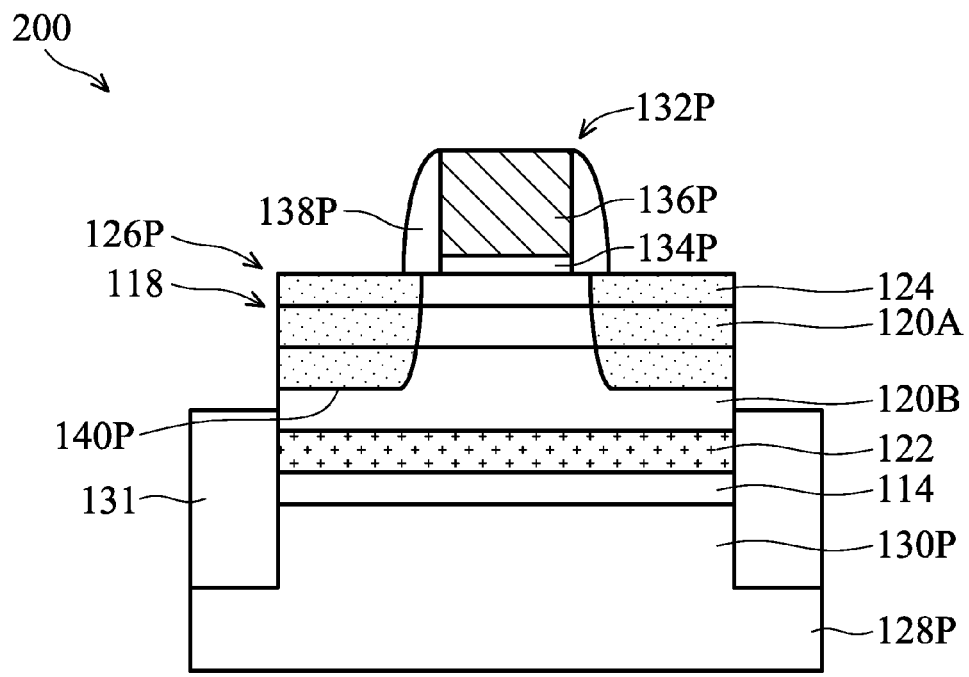
FIG. 2 is a cross-sectional view of a P-type metal-oxide-semiconductor structure in the semiconductor device in accordance with some embodiments of the present disclosure.
Figure 3:
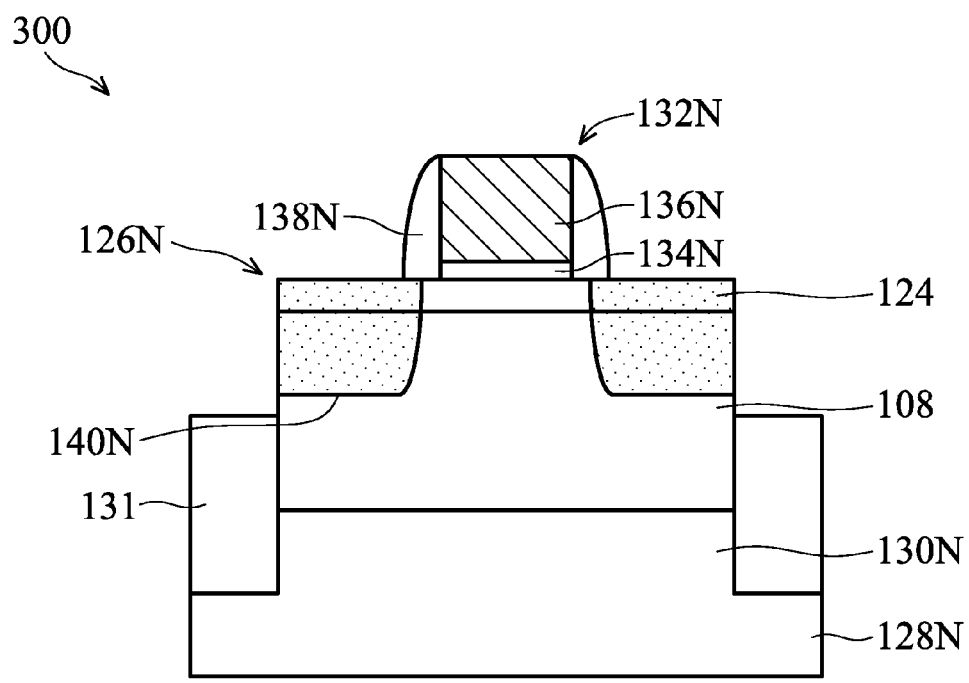
FIG. 3 is a cross-sectional view of an N-type metal-oxide-semiconductor structure in the semiconductor device in accordance with some embodiments of the present disclosure.

FIG. 2 is a cross-sectional view of a P-type metal-oxide-semiconductor structure 200 (PMOS structure) of the semiconductor device 1000 shown in FIG. 1G along the direction extending into the drawing shown in FIG. 1G. FIG. 3 is a cross-sectional view of an N-type metal-oxide-semiconductor structure 300 (NMOS structure) of the semiconductor device 1000 shown in FIG. 1G along the direction extending into the drawing shown in FIG. 1G.

As shown in FIG. 2, the width of the fin structures 126P is in a range from about 2 nm to about 10 nm, for example from about 5 nm to about 7 nm, in accordance with some embodiments. As shown in FIG. 3, the width of the fin structures 126N is in a range from about 2 nm to about 10 nm, for example from about 5 nm to about 7 nm, in accordance with some embodiments.

As shown in FIGS. 1G, 2 and 3, an isolation structure 131 is formed over the base portions 128P and 128N of the semiconductor substrate 100 and formed in the recesses to surround lower portions of the fin structures 126P and 126N, in accordance with some embodiments. The isolation structure 131 is adjacent to the fin structures 126P and 126N. In some embodiments, the isolation structure 131 continuously surrounds the lower portions of the fin structures 126P and 126N. Upper portions of the fin structures 126P and 126N protrude from the top surfaces of the isolation features 103.

In some embodiments, the isolation structure 131 includes a shallow trench isolation (STI) feature, a local oxidation of silicon (LOCOS) feature, another suitable isolation structure, or a combination thereof.

In some embodiments, the isolation structure 131 has a multi-layer structure. In some embodiments, the isolation structure 131 is made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation structure 131. The STI liner may also be used to reduce crystalline defects at the interface between the fin structures and the isolation structure 131.

In some embodiments, a dielectric layer is deposited over the semiconductor substrate 100 using a chemical vapor deposition (CVD) process, a spin-on process, another applicable process, or a combination thereof. The dielectric layer covers the fin structures including the fin structures 126P and 126N and fills the recesses between the fin structures. In some embodiments, a planarization process is performed to thin down the dielectric layer. For example, the dielectric layer is thinned until the fin structures 126P and 126N are exposed. The planarization process may include a chemical mechanical polishing (CMP) process, a grinding process, a dry polishing process, an etching process, another applicable process, or a combination thereof. Afterwards, the dielectric layer is etched back to below the top of the fin structures 126P and 126N. As a result, the isolation structure 131 is formed. The fin structures 126P and 126N protrude from the top surface of the isolation structure 131, as shown in FIGS. 1G, 2 and 3 in accordance with some embodiments.

As shown in FIGS. 1G and 2 and 3, two or more gate structures are formed over the fin structures 126P and 126N, in accordance with some embodiments. For example, in some embodiments of the present disclosure, a gate structure 132P is formed over fin structures 126P, and a gate structure 132N is formed over the fin structures 126N.

As shown in FIGS. 1G and 2, the gate structure 132P includes a gate dielectric layer 134P over the fin structures 126P and a gate electrode 136P over the gate dielectric layer 134P, in accordance with some embodiments. In addition, as shown in FIGS. 1G and 3, the gate structure 132N includes a gate dielectric layer 134N over the fin structures 126N and a gate electrode 136N over the gate dielectric layer 134N, in accordance with some embodiments.

In some embodiments, each of the gate dielectric layers 134P and 134N is made of silicon oxide, silicon nitride, silicon oxynitride, high-k material, any other suitable dielectric material, or a combination thereof. In some embodiments of the present disclosure, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof.

In some embodiments, each of the gate electrodes 136P and 136N is made of polysilicon, a metal material, another suitable conductive material, or a combination thereof. In some embodiments of the present disclosure, the metal material may include, but is not limited to, copper, aluminum, tungsten, molybdenum, titanium, tantalum, platinum, or hafnium. In some embodiments, the gate electrode 136N and/or 136P is a dummy gate electrode and will be replaced with another conductive material such as a metal material. The dummy gate electrode layer is made of, for example, polysilicon.

In some embodiments, a gate channel material layer (not shown) and a gate electrode material layer (not shown) are sequentially deposited over the fin structures 126P and 126N. In some embodiments, the gate channel material layer and the gate electrode material layer are sequentially deposited by using suitable deposition methods. In some embodiments of the present disclosure, the suitable deposition methods for depositing the gate channel material layer may include a chemical vapor deposition (CVD) process, an atomic layer deposition (ALD) process, a thermal oxidation process, a spin-on coating process, another applicable process, or a combination thereof. In some embodiments of the present disclosure, the suitable deposition methods for depositing the gate electrode material layer may include a chemical vapor deposition (CVD), a physical vapor deposition (PVD) process, or any other suitable methods.

Afterwards, according to some embodiments of the present disclosure, the gate channel material layer and the gate electrode material layer are patterned to form the gate structure 132P including the gate dielectric layer 134P and the gate electrode 136P, and form the gate structure 132N including the gate dielectric layer 134N and the gate electrode 136N.

As shown in FIG. 2, the gate structure 132P is positioned over the channel layer 118 and covers a portion of the fin structure 126P, in accordance with some embodiments. As shown in FIG. 3, the gate structure 132N is positioned over the semiconductor material layer 108 and covers a portion of the fin structure 126N, in accordance with some embodiments.

As shown in FIGS. 1G and 2, spacer elements 138P are formed over sidewalls of the gate structure 132P, in accordance with some embodiments. In addition, as shown in FIGS. 1G and 3, spacer elements 138N are formed over sidewalls of the gate structure 132N, in accordance with some embodiments. In some embodiments, the spacer elements 138N and 138P are made of silicon nitride, silicon oxynitride, silicon carbide, another suitable material, or a combination thereof.

In some embodiments, a spacer layer is deposited over the semiconductor substrate 100 and the gate structures 132P and 132N. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the gate structure 132N form the spacer elements 138N, and the remaining portions of the spacer layer over the sidewalls of the gate structure 132P form the spacer elements 138P.

Subsequently, two source/drain structures 140P are formed in the fin structures 126P to form a PMOS structure 200, as shown in FIG. 2 in accordance with some embodiments. In some embodiments, an implantation mask layer (not shown) is used to cover the NMOS region 102N. Afterwards, an implantation process is performed, also with the gate structure 132P as an implantation mask, to form the source/drain structures 140P. In some embodiments, P-type dopants are implanted into the fin structures 126P to form the source/drain structures 140P, without being implanted into the NMOS region 102N. After the source/drain structures 140P are formed, the implantation mask layer is removed.

The source/drain structures 140P are adjacent to the gate structure 132P and are respectively on opposite sides of the gate structure 132P and in the fin structures 126P. In some embodiments, a portion of the source/drain structures 140P is near the gate structure 132P and underneath the spacer elements 138P. In some embodiments, the implantation processes are performed at an angle such that the formed source/drain structures 140P extend under the gate structure 132P. In some embodiments of the present disclosure, the source/drain structures 140P are also formed in the cap layer 124.

In some embodiments of the present disclosure, the source/drain structures 140P do not come into contact with the second buffer material layer 122. As shown in FIG. 2, the source/drain structure is spaced apart from the second buffer material layer 122 by the second portion 120B of the channel layer 118, in accordance with some embodiments.

In some cases, the second buffer material layer is not formed. In this embodiment, the stress at the end portion of the fin structure may be relaxed, and the performance of the device may be degraded. In comparison, in some other cases, the second buffer material layer is formed. Since the carbon in the second buffer material layer may impart additional stress or strain to the end portion of the fin structure, the fin-end stress relaxation issue may be reduced or prevented. Therefore, the performance of the device is improved.

Embodiments of the disclosure have many variations. For example, in some embodiments, the source/drain structures 140P are not covered by the spacer elements 138P. In some other embodiments, the source/drain structures 140P further extend under the gate structure 132P and are covered by the gate structure 132P.

Subsequently, two source/drain structures 140N are formed in the fin structures 126N to form an NMOS structure 300, as shown in FIG. 3 in accordance with some embodiments. In some embodiments, an implantation mask layer (not shown) is used to cover the PMOS region 102P. Afterwards, an implantation process is performed, also with the gate structure 132N as an implantation mask, to form the source/drain structures 140N. In some embodiments, N-type dopants are implanted into the fin structures 126N to form the source/drain structures 140N, without being implanted into the PMOS region 102P. After the source/drain structures 140N are formed, the implantation mask layer is removed.

The source/drain structures 140N are adjacent to the gate structure 132N and are respectively on opposite sides of the gate structure 132N and in the fin structures 126N. In some embodiments, a portion of the source/drain structures 140N is near the gate structure 132N and underneath the spacer elements 138N. In some embodiments, the implantation processes are performed at an angle such that the formed source/drain structures 140N extend under the gate structure 132N. In some embodiments of the present disclosure, the source/drain structures 140N are also formed in the cap layer 124. In some other embodiments, the source/drain structures 140N may be formed before the source/drain structures 140P.

Embodiments of the disclosure have many variations. For example, in some embodiments, the source/drain structures 140N are not covered by the spacer elements 138N. In some other embodiments, the source/drain structures 140N further extend under the gate structure 132N and are covered by the gate structure 132N.

Afterwards, an annealing process, such as a rapid thermal process (RTP), may be performed to repair the crystal structure of the silicon in the source/drain structures 140P and 140N and activate the dopant in the source/drain structures 140P and 140N.

In some embodiments of the present disclosure, the semiconductor device 1000 is a complementary metal-oxide-semiconductor. In some embodiments of the present disclosure, as shown in FIG. 1G, the semiconductor device 1000 includes the P-type metal-oxide-semiconductor structure

200 and the N-type metal-oxide-semiconductor structure 300, in accordance with some embodiments.

It should be noted that the exemplary embodiment set forth in FIGS. 1A-3 is merely for the purpose of illustration. In addition to the embodiment set forth in FIGS. 1A-3, the second buffer material layer may be formed by another process flow as shown in FIGS. 4A-4D. For example, the silicon germanium carbide buffer layer may be directly formed without forming the silicon carbide buffer layer first. This will be described in detail in the following description. Therefore, the inventive concept and scope are not limited to the exemplary embodiment shown in FIGS. 1A-3.

Note that the same or similar elements or layers corresponding to those of the semiconductor device are denoted by like reference numerals. The same or similar elements or layers denoted by like reference numerals have the same meaning and will not be repeated for the sake of brevity.

Figure 4A:
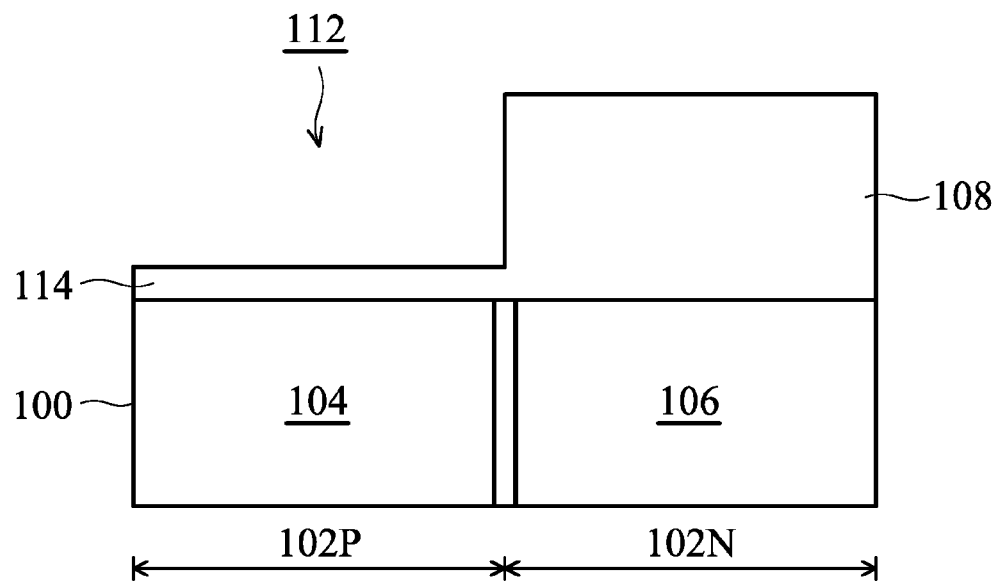
FIGS. 4A-4D are cross-sectional views of various stages of a process for forming a semiconductor device, in accordance with some embodiments.

FIGS. 4A-4D are cross-sectional views of various stages of a process for forming a semiconductor device, in accordance with some embodiments. As shown in FIG. 4A, a structure similar to that shown in FIG. 1C is provided or received, in accordance with some embodiments.

Figure 4B:
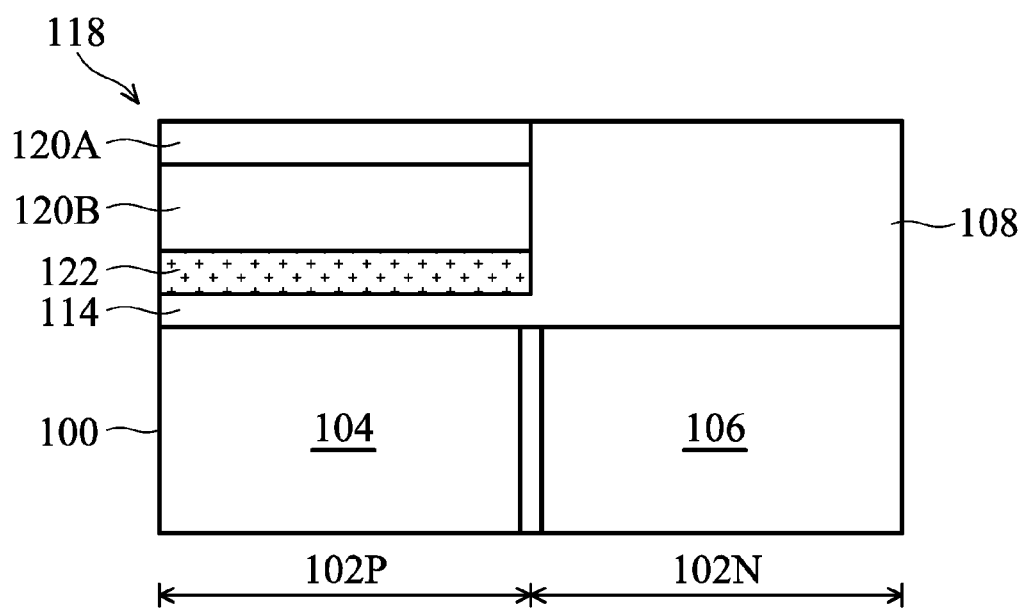

As shown in FIG. 4B, the second buffer material layer 122 is formed over the top surface of the semiconductor layer 114 and formed in the recess 112 directly, in accordance with some embodiments. In some embodiments of the present disclosure, no silicon carbide buffer layer (or the first buffer material layer) is formed.

In some embodiments, the second buffer material layer 122 is a silicon germanium carbide buffer layer. The second buffer material layer 122 may include epitaxially grown silicon germanium carbide, or another suitable epitaxially grown buffer material.

In some embodiments, a silicon germanium carbide is epitaxially grown in the recess 112 to form the second buffer material layer 122. In particular, in some embodiments, the second buffer material layer 122 is directly formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the second buffer material layer 122 may use gaseous and/or liquid precursors.

In some embodiments, in the formation process of the second buffer material layer 122, the operation temperature is in a range from about 400° C. to about 800° C., for example about 550° C. to about 650° C., and the operation pressure is in a range from about 1 torr to about 200 torr, for example about 50 torr to about 100 torr. In some embodiments of the present disclosure, the precursor for silicon is dichlorosilane or silane (silicon tetrahydride), the precursor for germanium is germane ($GeH_4$), and the precursor for carbon is methylsilane. In some embodiments of the present disclosure, a hydrogen gas or a nitrogen gas is used as a gas carrier.

As shown in FIG. 4B, a channel layer 118 is formed over the second buffer material layer 122 in the recess 112 using a process that is the same as or similar to that shown in FIG. 1D, in accordance with some embodiments.

Figure 4C:
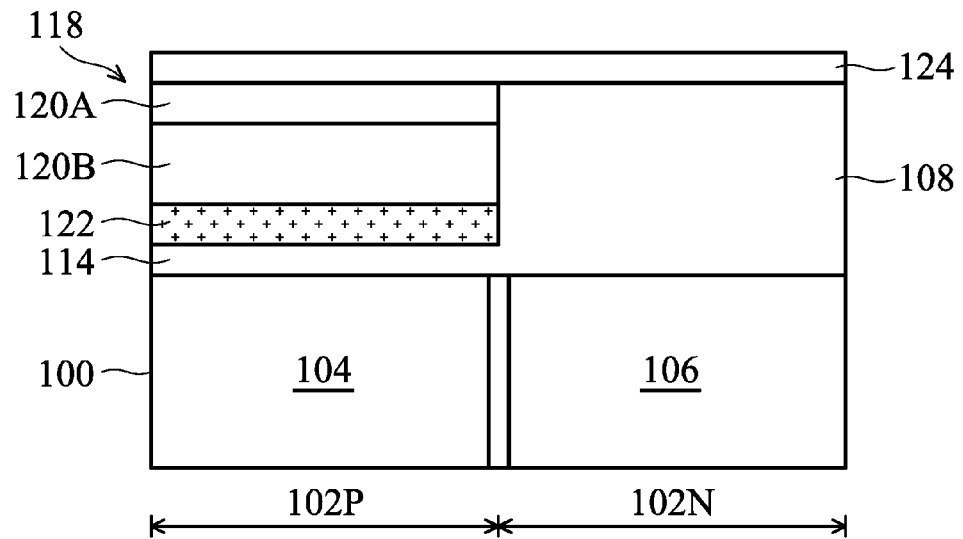

As shown in FIG. 4C, a cap layer 124 is deposited over the channel layer 118 in the PMOS region 102P and over the semiconductor material layer 108 in the N-well region 104 using a process that is the same as or similar to that shown in FIG. 1E, in accordance with some embodiments.

Figure 4D:
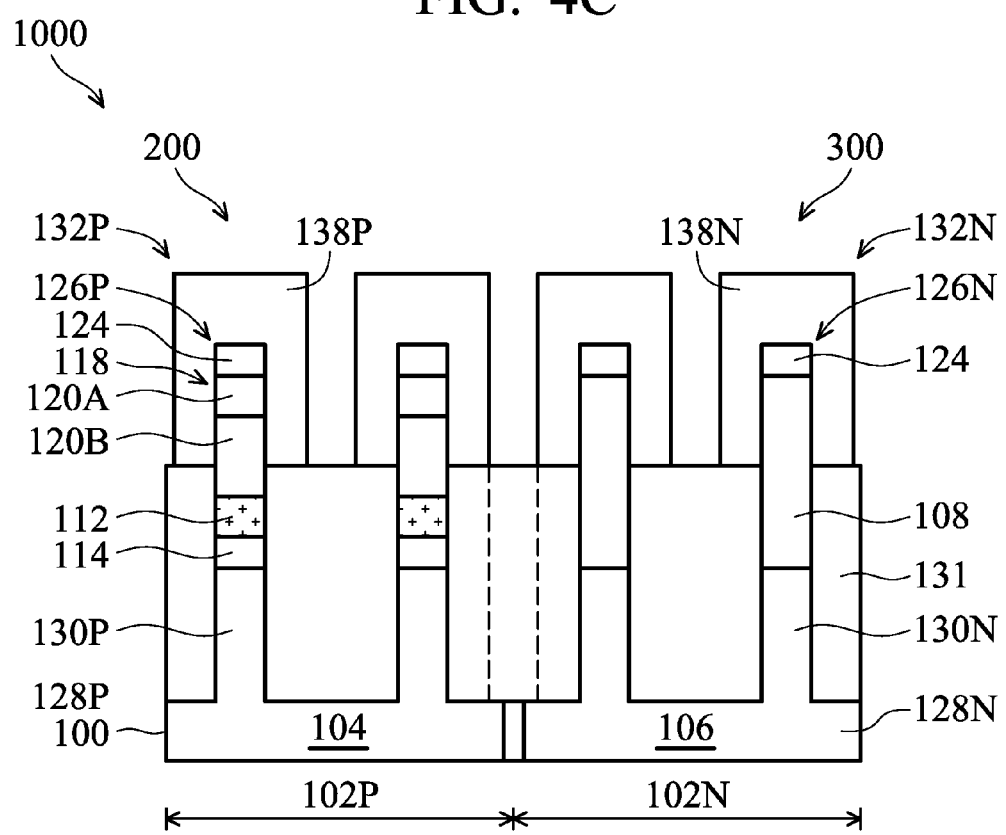

As shown in FIG. 4D, a semiconductor device 1000 including the P-type metal-oxide-semiconductor structure 200 and the N-type metal-oxide-semiconductor structure 300 is formed using a process that is the same as or similar to that shown in FIGS. 1F-1G and FIGS. 2-3, in accordance with some embodiments.

Figure 5A:
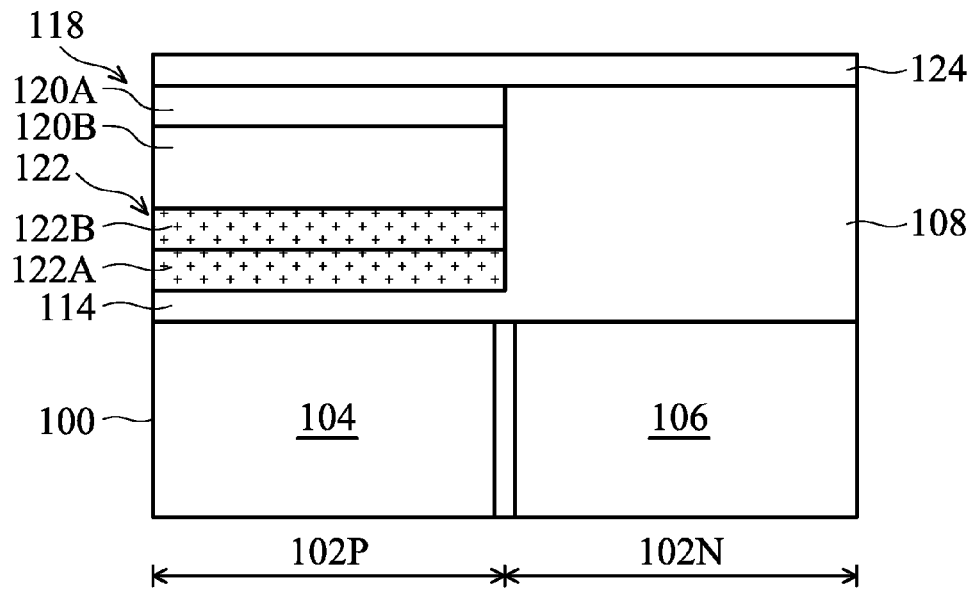
FIG. 5A is a cross-sectional view of a semiconductor device in one stage of a manufacturing method of the semiconductor device according with some embodiments of the present disclosure.

It should be noted that the exemplary embodiments set forth in FIGS. 1A-4D are merely for the purpose of illustration. In addition to the embodiments set forth in FIGS. 1A-4D, the silicon germanium carbide buffer layer may have other configuration as shown in FIGS. 5A-6. This will be described in detail in the following description. Therefore, the inventive concept and scope are not limited to the exemplary embodiments set forth in FIGS. 1A-4D.

Note that the same or similar elements or layers corresponding to those of the semiconductor device are denoted by like reference numerals. The same or similar elements or layers denoted by like reference numerals have the same meaning and will not be repeated for the sake of brevity.

As shown in FIG. 5A, the second buffer material layer 122 includes at least two portions with different carbon concentrations, in accordance with some embodiments. For example, as shown in FIG. 5A, the second buffer material layer 122 includes a lower portion 122A formed over the top surface of the semiconductor layer 114 and formed in the recess 112, in accordance with some embodiments. In addition, as shown in FIG. 5A, the second buffer material layer 122 includes an upper portion 122B formed over the lower portion 122A.

In some embodiments of the present disclosure, each of the lower portion 122A and the upper portion 122B of the second buffer material layer 122 is formed directly without forming the silicon carbide buffer layer using a process that is the same as or similar to that shown in FIG. 4B.

As shown in FIG. 5A, the channel layer 118 and the cap layer 124 is formed using a process that is the same as or similar to that shown in FIGS. 1D and 1E, in accordance with some embodiments.

In some embodiments of the present disclosure, the lower portion 122A has an atomic concentration of carbon greater than that of the upper portion 122B. In some embodiments of the present disclosure, compared to the upper portion 122B, the lattice constant of the lower portion 122A is closer to the lattice constant of the semiconductor layer 114. In some cases, the lower portion 122A may reduce the lattice mismatch between the second buffer material layer 122 and the semiconductor layer 114.

In some embodiments of the present disclosure, compared to the lower portion 122A, the lattice constant of the upper portion 122B is closer to the lattice constant of the second portion 120B of the channel layer 118. In some cases, the upper portion 122B may reduce the lattice mismatch between the second buffer material layer 122 and the channel layer 118.

Figure 5B:
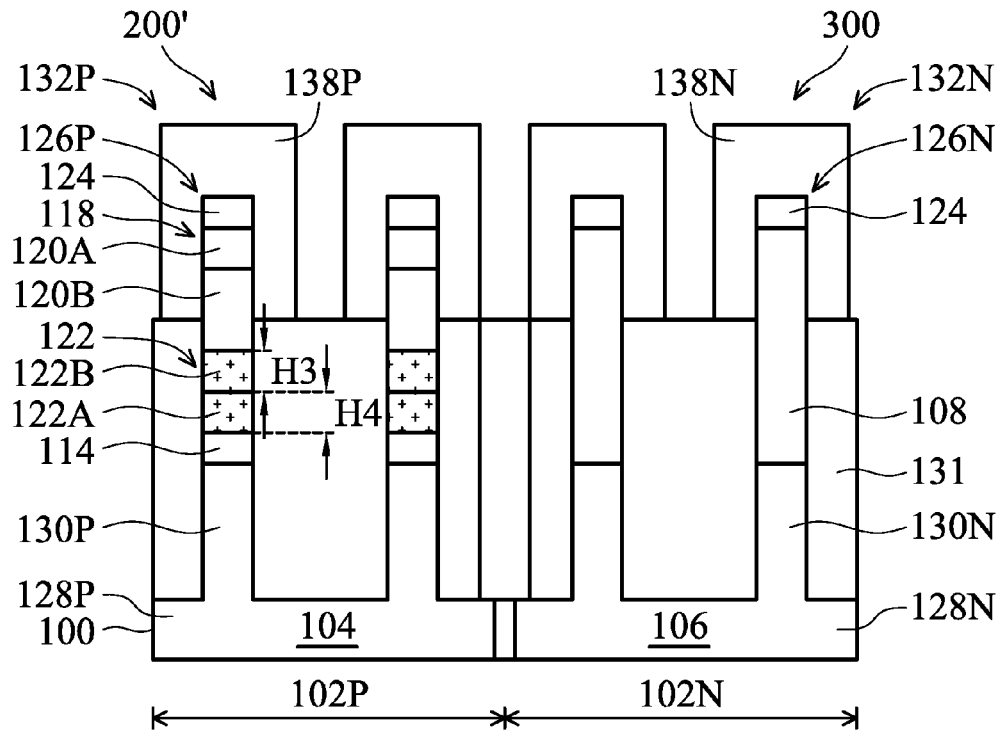
FIG. 5B is a cross-sectional view of a semiconductor device in one stage of a manufacturing method of the semiconductor device according with some embodiments of the present disclosure.
Figure 6:
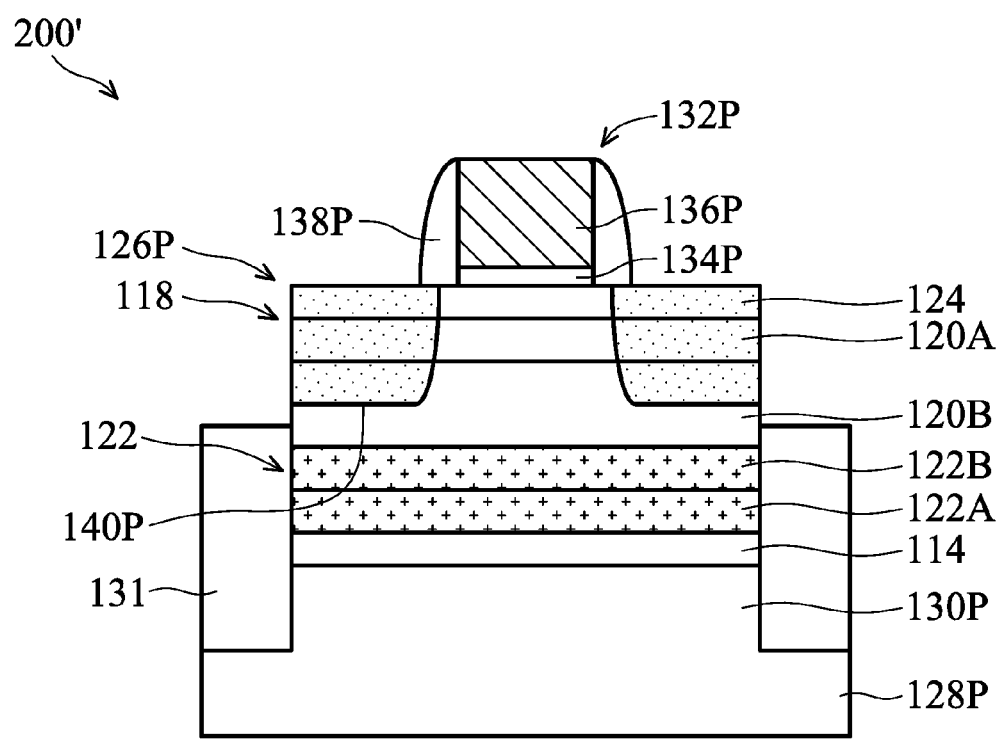
FIG. 6 is a cross-sectional view of a P-type metal-oxide-semiconductor structure in the semiconductor device in accordance with some embodiments of the present disclosure.

As shown in FIG. 5B, a semiconductor device 5000 including the P-type metal-oxide-semiconductor structure 200' and the N-type metal-oxide-semiconductor structure 300 is formed using a process that is the same as or similar to that shown in FIGS. 1F-1G and FIGS. 2-3, in accordance with some embodiments.

As shown in FIG. 5B, the upper portion 122B has a third height H3, and the lower portion 122A has a fourth height H4, in accordance with some embodiments. In some embodiments of the present disclosure, the third height H3 is greater than or equal to the fourth height H4. In some embodiments of the present disclosure, the ratio of the third height H3 to the fourth height H4 (H3/H4) is in a range from about 1 to about 10, for example, from about 3 to about 8.

FIG. 6 is a cross-sectional view of a P-type metal-oxide-semiconductor structure (PMOS structure) 200' of the semiconductor device 5000 shown in FIG. 5B along the direction extending into the drawing shown in FIG. 5B. The difference between the embodiment shown in FIG. 6 and the embodiment shown in FIG. 2 is that the second buffer material layer 122 of the P-type metal-oxide-semiconductor structure 200' includes at least two portions. For example, the second buffer material layer 122 of the PMOS structure 200' includes the upper portion 122B and the lower portion 122A with different carbon concentrations.

In some other embodiments of the present disclosure, the second buffer material layer 122 includes more than two portions with different carbon concentrations. In some embodiments, for every two adjacent portions in the second buffer material layer 122, the lower portion has an atomic concentration of carbon greater than the atomic concentration of carbon of the upper portion.

It should be noted that the exemplary embodiments set forth in FIGS. 1A-6 are merely for the purpose of illustration. In addition to the embodiments set forth in FIGS. 1A-6, the channel layer of the NMOS structure may be made of silicon carbide, and the semiconductor device may be formed by another process flow as shown in FIGS. 7A-7F. For example, the silicon germanium carbide buffer layer may have another configuration. This will be described in detail in the following description. Therefore, the inventive concept and scope are not limited to the exemplary embodiments set forth in FIGS. 1A-6.

Note that the same or similar elements or layers corresponding to those of the semiconductor device are denoted by like reference numerals. The same or similar elements or layers denoted by like reference numerals have the same meaning and will not be repeated for the sake of brevity.

Figure 7A:
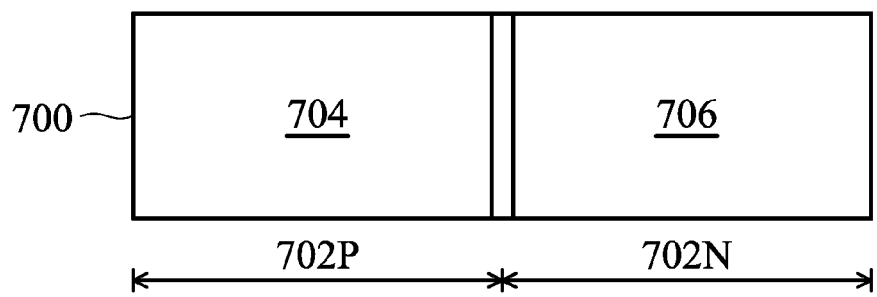
FIGS. 7A-7F are cross-sectional views of various stages of a process for forming a semiconductor device, in accordance with some embodiments.

FIGS. 7A-7F are cross-sectional views of various stages of a process for forming a semiconductor device, in accordance with some embodiments. As shown in FIG. 7A, a semiconductor substrate 700 is received or provided, in accordance with some embodiments.

As shown in FIG. 7A, the semiconductor substrate 700 has a P-type metal-oxide-semiconductor region 702P (PMOS region 702P) and an N-type metal-oxide-semiconductor region 702N (NMOS region 702N) adjacent to the PMOS region 702P, in accordance with some embodiments. In some embodiments of the present disclosure, the PMOS region 702P is used to form a PMOS structure therein, whereas the NMOS region 702N is used to form an NMOS structure therein.

In some embodiments, as shown in FIG. 7A, an N-well region 704 and a P-well region 706 are formed sequentially in the semiconductor substrate 700 using a process that is the same as or similar to that shown in FIG. 1A.

Figure 7B:
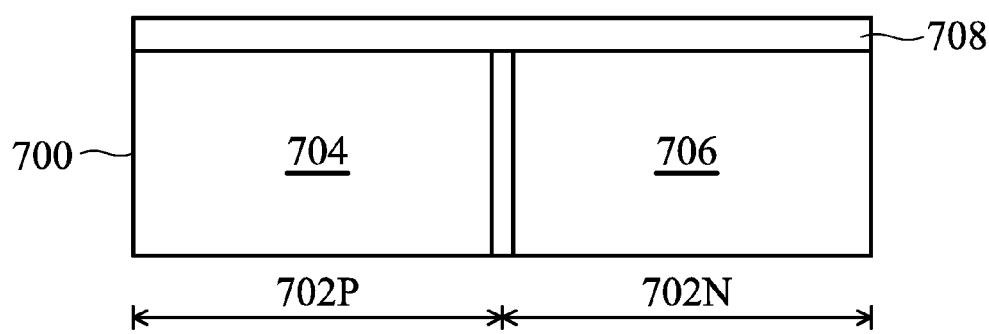

Afterward, as shown in FIG. 7B, a semiconductor material layer 708 is deposited over the semiconductor substrate 700. In some embodiments of the present disclosure, the semiconductor material layer 708 is substantially made of silicon. In some other embodiments, the semiconductor material layer 708 is substantially made of Ge, Si/Ge, III-V compound, or a combination thereof.

In some embodiments of the present disclosure, the semiconductor material layer 708 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments of the present disclosure, the semiconductor material layer 708 is an un-doped semiconductor material layer.

Figure 7C:
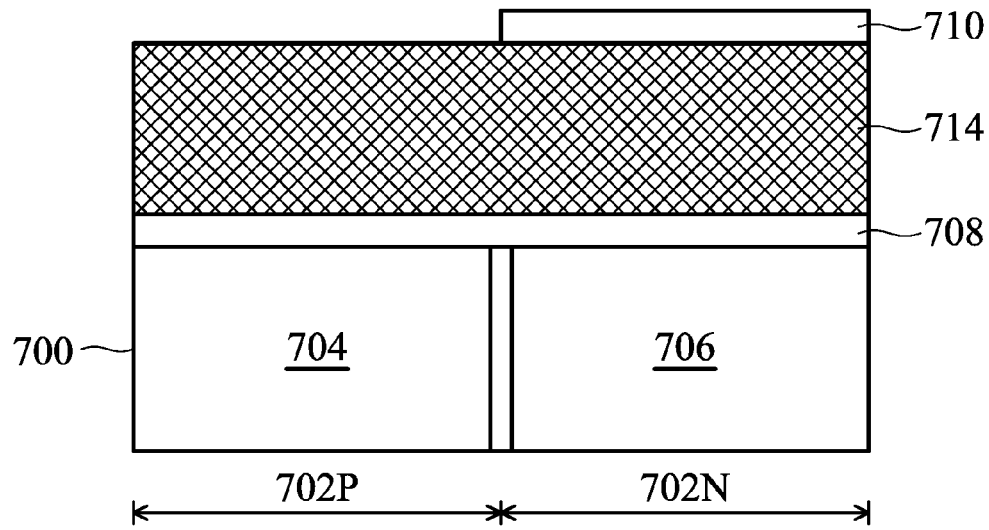

As shown in FIG. 7C, a silicon carbide material layer 714 is formed over the top surface of the semiconductor material layer 708, in accordance with some embodiments. In some embodiments, the silicon carbide material layer 714 is made of silicon carbide. In some embodiments of the present disclosure, the silicon carbide material layer 714 may include epitaxially grown silicon carbide (SiC), or another suitable epitaxially grown buffer material. In some embodiments of the present disclosure, the silicon carbide material layer 714 has an atomic concentration of carbon in a range from about 0.5 atom % to about 10 atom %, for example from about 2 atom % to about 5 atom %.

In some embodiments, a silicon carbide is epitaxially grown over the top surface of the semiconductor material layer 708 to form the silicon carbide material layer 714. In particular, in some embodiments, the silicon carbide material layer 714 is formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the silicon carbide material layer 714 may use gaseous and/or liquid precursors. In some embodiments, the silicon carbide material layer 714 is formed with carbon (C) doped in-situ during the growth of the silicon carbide material layer 714.

As shown in FIG. 7C, a mask layer 710 is formed over the silicon carbide material layer 714, in accordance with some embodiments. As shown in FIG. 7C, the mask layer 710 covers the portion of the semiconductor material layer 708 in the NMOS region 702N, in accordance with some embodiments. The mask layer 710 has an opening which exposes another portion of the semiconductor material layer 708 in the PMOS region 702P. In some embodiments, the mask layer 710 is a patterned photoresist layer. In some other embodiments, the mask layer 710 is a patterned dielectric layer, such as a silicon oxide, silicon nitride, silicon oxynitride, another suitable dielectric material, or a combination thereof.

Figure 7D:
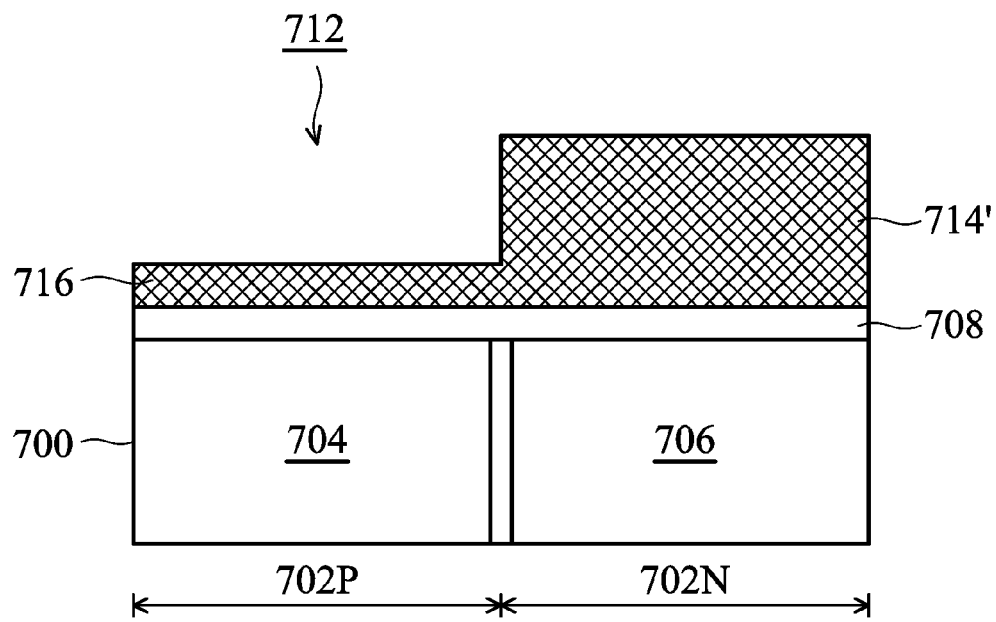

As shown in FIG. 7D, the portion of the silicon carbide material layer 714 in the PMOS region 702P, which is exposed by the mask layer 710, is partially removed to form a recess 712 in the PMOS region 702P, in accordance with some embodiments.

As shown in FIG. 7D, the remaining portion of the silicon carbide material layer 714 in the PMOS region 702P forms the first buffer material layer 716, in accordance with some embodiments. In some embodiments of the present disclosure, the first buffer material layer 716 is substantially made of silicon carbide. In addition, in some embodiments of the present disclosure, the remaining portion of the silicon carbide material layer 714 in the NMOS region 702N serves as a silicon carbide channel layer 714' of the subsequent NMOS structure.

Figure 7E:
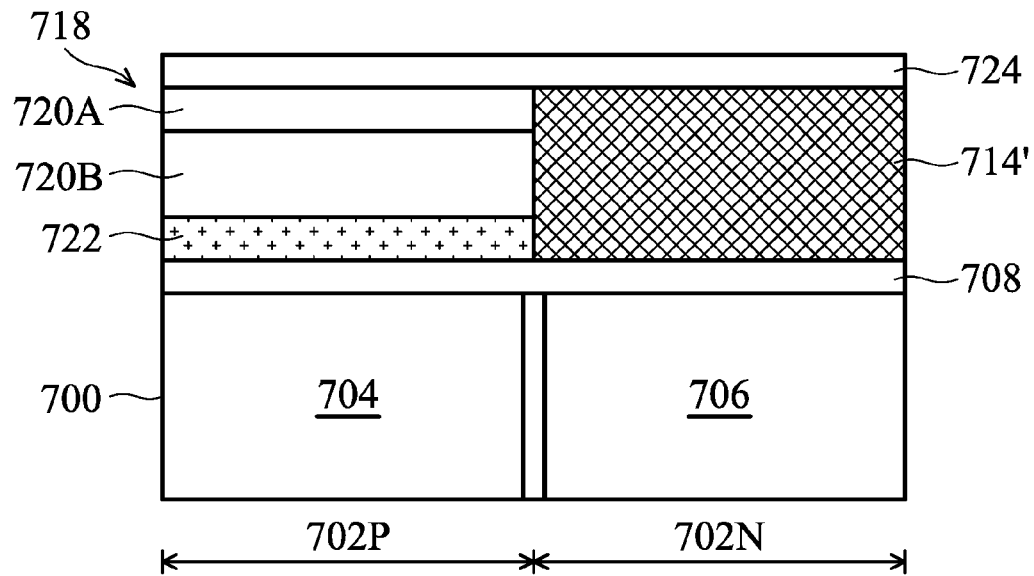

As shown in FIG. 7E, a channel layer 718 is formed over the first buffer material layer 716 in the recess 712 using a process that is the same as or similar to that shown in FIG. 1D, in accordance with some embodiments. In some embodiments of the present disclosure, the channel layer 718 is a silicon germanium channel layer.

As shown in FIG. 7E, the channel layer 718 includes at least two portions with different germanium concentrations, in accordance with some embodiments. For example, the channel layer 718 has a first portion 720A and a second portion 720B between the first portion 720A and the first buffer material layer 716 or the subsequently formed second buffer material layer 722 as shown in FIG. 7E in accordance with some embodiments. In some embodiments of the present disclosure, the first portion 720A has an atomic concentration of germanium greater than that of the second portion 720B.

As shown in FIG. 7E, a cap layer 724 is deposited over the channel layer 718 in the PMOS region 702P and over the silicon carbide channel layer 714' in the N-well region 704, in accordance with some embodiments.

In some embodiments of the present disclosure, the cap layer 724 is substantially made of silicon. In some embodiments, the cap layer 724 is deposited using a CVD process, an ALD process, a spin-on process, a spray coating process, another applicable process, or a combination thereof.

After forming the cap layer 724, the channel layer 718 is exposed to a thermal process to activate the dopants, in accordance with some embodiments. In some embodiments of the present disclosure, thermal process is an annealing process, such as a rapid thermal annealing process.

As shown in FIG. 7E, a portion of germanium of the channel layer 718 is diffused into the first buffer material layer 716 to form a second buffer material layer 722 in thermal process, in accordance with some embodiments. In some embodiments of the present disclosure, the first buffer material layer 716 is a silicon carbide buffer layer, and germanium in the channel layer 718 is diffused into the silicon carbide buffer layer to form the second buffer material layer 722 containing silicon (Si), germanium (Ge), and carbon (C).

In some embodiments of the present disclosure, the second buffer material layer 722 is a silicon germanium carbide buffer layer formed from the first buffer material layer 716. As shown in FIG. 7E, the first buffer material layer 716 is replaced by the second buffer material layer 722, in accordance with some embodiments. In some embodiments of the present disclosure, the second buffer material layer 722 is also referred to as a carbon-containing buffer layer.

It should be noted that, in some embodiments of the present disclosure, a portion of germanium of the channel layer 718 is also diffused into a portion of the silicon carbide channel layer 714' adjacent to the channel layer 718. However, since the diffusion distance is very small compared to the width of the silicon carbide channel layer 714', this diffusion of germanium into the silicon carbide channel layer 714' and the resulting silicon germanium carbide portion is omitted from FIG. 7E.

Figure 7F:
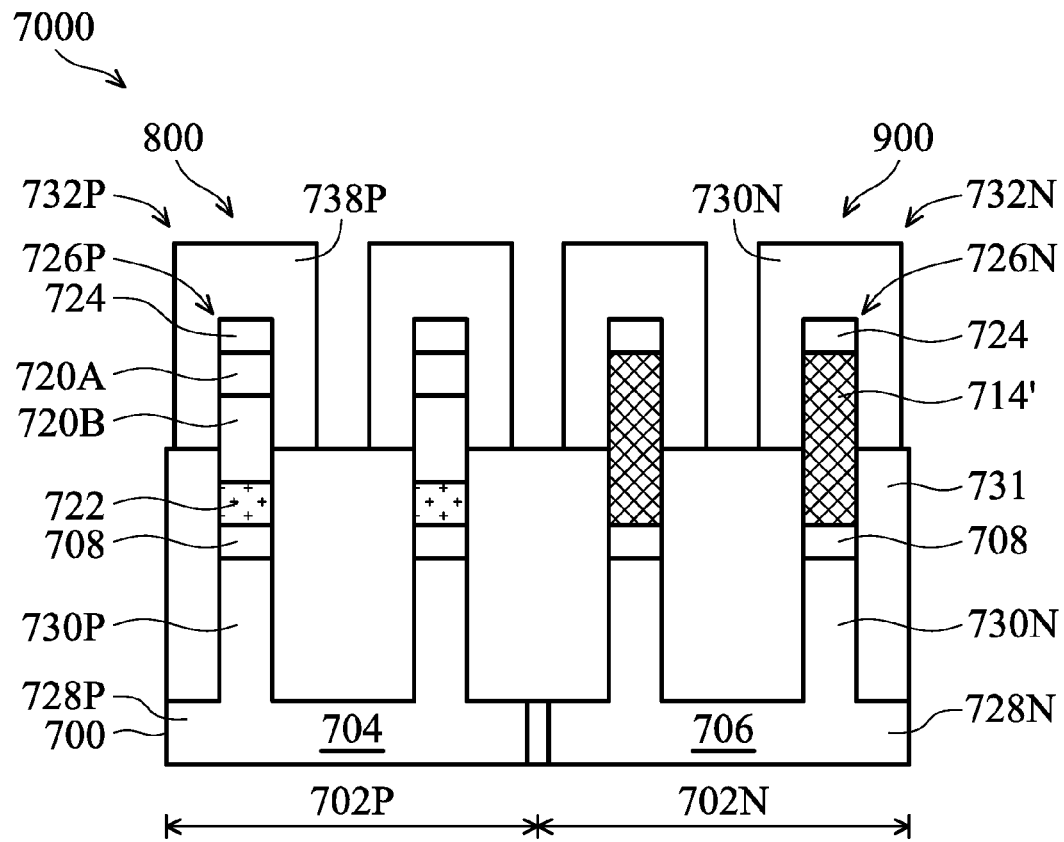

As shown in FIG. 7F, a semiconductor device 7000 including a P-type metal-oxide-semiconductor structure 800 and an N-type metal-oxide-semiconductor structure 900 is formed using a similar process to that shown in FIGS. 1F-1G and FIGS. 2-3, in accordance with some embodiments.

As shown in FIG. 7F, one or more fin structures are formed over the semiconductor substrate 700 using etching processes. As shown in FIG. 7F, fin structures 726P in the PMOS region 702P and fin structures 726N in the NMOS region 702N are formed, in accordance with some embodiments.

As shown in FIG. 7F, the N-well region 704 of the etched semiconductor substrate 700 in the PMOS region 702P includes a base portion 728P and a protrusion portion 730P over the base portion 728P, in accordance with some embodiments. As shown in FIG. 7F, the fin structure 726P includes the protrusion portion 730P of the semiconductor substrate 700 over the base portion 728P, the semiconductor material layer 708 over the protrusion portion 730P, the second buffer material layer 722 over the semiconductor material layer 708, the channel layer 718 including the first portion 720A and the second portion 720B over the second buffer material layer 722, and the cap layer 724 over the channel layer 718, in accordance with some embodiments.

As shown in FIG. 7F, the P-well region 706 of the etched semiconductor substrate 700 in the NMOS region 702N includes a base portion 728N and a protrusion portion 730N over the base portion 728N, in accordance with some embodiments. As shown in FIG. 7F, the fin structure 726N includes the protrusion portion 730N of the semiconductor substrate 700 over the base portion 728N, the semiconductor material layer 708 over the protrusion portion 730N, the silicon carbide channel layer 714' over the semiconductor material layer 708, and the cap layer 724 over the silicon carbide channel layer 714', in accordance with some embodiments.

In some embodiments of the present disclosure, in the PMOS region 702P, the lattice constant of the second portion 720B of the channel layer 718 is greater than the lattice constant of the second buffer material layer 722. In some embodiments of the present disclosure, the lattice constant of the semiconductor substrate 700 is greater than the lattice constant of the second buffer material layer 722. In some embodiments of the present disclosure, the lattice constant of the semiconductor material layer 708 is also greater than the lattice constant of the second buffer material layer 722.

In some embodiments of the present disclosure, in the NMOS region 702N, the lattice constant of the silicon carbide channel layer 714' is less than the lattice constant of the semiconductor substrate 700. In some embodiments of the present disclosure, the lattice constant of the silicon carbide channel layer 714' is less than the lattice constant of the semiconductor material layer 708 in the NMOS region 702N.

Figure 8:
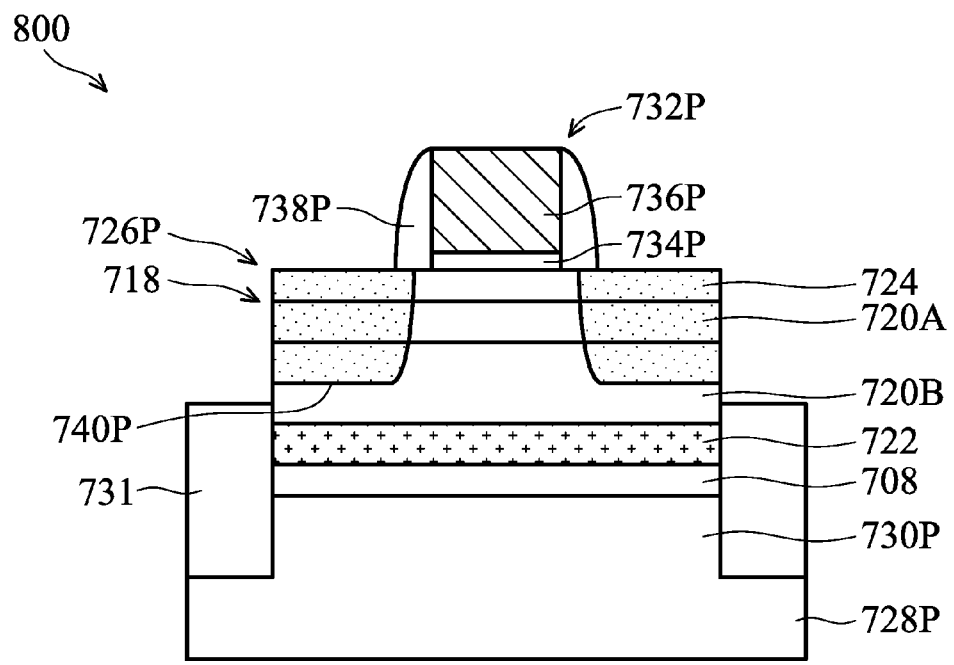
FIG. 8 is a cross-sectional view of a P-type metal-oxide-semiconductor structure in the semiconductor device in accordance with some embodiments of the present disclosure.
Figure 9:
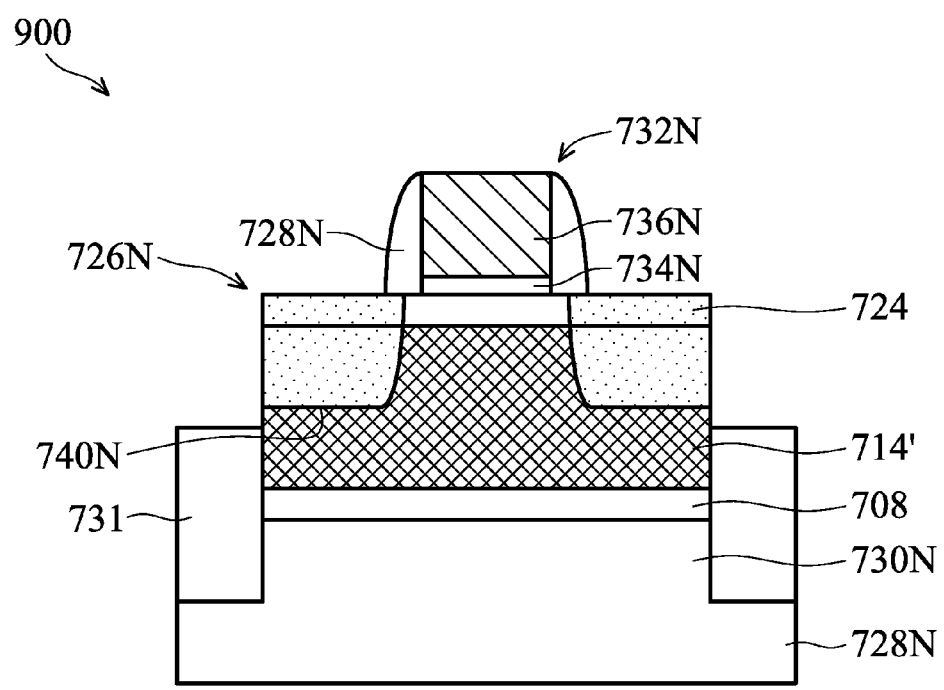
FIG. 9 is a cross-sectional view of an N-type metal-oxide-semiconductor structure in the semiconductor device in accordance with some embodiments of the present disclosure.

FIG. 8 is a cross-sectional view of a P-type metal-oxide-semiconductor structure 800 (PMOS structure) of the semiconductor device 7000 shown in FIG. 7F along the direction extending into the drawing shown in FIG. 7F. FIG. 9 is a cross-sectional view of an N-type metal-oxide-semiconductor structure 900 (NMOS structure) of the semiconductor device 7000 shown in FIG. 7F along the direction extending into the drawing shown in FIG. 7F.

As shown in FIGS. 7F, 8 and 9, an isolation structure 731 are formed over the base portions 728P and 728N of the semiconductor substrate 700 and formed in the recesses to surround lower portions of the fin structures 726P and 726N using a process that is the same as or similar to that shown in FIG. 1G, in accordance with some embodiments.

As shown in FIGS. 7F, 8 and 9, two or more gate structures are formed over the fin structures 726P and 726N using a process that is the same as or similar to that shown in FIGS. 1G, 2, and 3, in accordance with some embodiments. For example, in some embodiments of the present disclosure, a gate structure 732P including a gate dielectric layer 734P over the fin structures 726P and a gate electrode 736P over the gate dielectric layer 734P is formed over fin structures 726P, and a gate structure 732N including a gate dielectric layer 734N over the fin structures 726N and a gate electrode 736N over the gate dielectric layer 734N is formed over the fin structures 726N.

As shown in FIGS. 7F, 8 and 9, spacer elements 738P are formed over sidewalls of the gate structure 732P and spacer elements 738N are formed over sidewalls of the gate structure 732N using a process that is the same as or similar to that shown in FIGS. 1G, 2, and 3, in accordance with some embodiments.

Subsequently, two source/drain structures 740P are formed in the fin structures 726P to form a PMOS structure 800, as shown in FIG. 8 in accordance with some embodiments. In addition, in some embodiments of the present disclosure, two source/drain structures 740N are formed in the fin structures 726N to form an NMOS structure 900, as shown in FIG. 9 in accordance with some embodiments. In some embodiments of the present disclosure, the NMOS structure 900 has a silicon carbide channel layer 714' rather than a silicon channel layer. In some embodiments of the present disclosure, the source/drain structures 740N are formed in the silicon carbide channel layer 714' and the cap layer 724.

Embodiments of the disclosure use a carbon-containing buffer layer, such as a silicon germanium carbide buffer layer between the channel layer and the semiconductor layer in the PMOS structure to reduce the lattice constant difference in the fin structure of the device. As a result, the quality and reliability of the semiconductor device are significantly improved.

In accordance with some embodiments, a semiconductor device is provided. The semiconductor device includes a semiconductor substrate having a P-type metal-oxide-semiconductor region (PMOS region) and an N-type metal-oxide-semiconductor region (NMOS region), and the semiconductor substrate has a first lattice constant. The semiconductor device further includes a first fin structure over the PMOS region of the semiconductor substrate and a second fin structure over the NMOS region of the semiconductor substrate. The first fin structure includes a semiconductor layer, a buffer layer over the semiconductor layer. The buffer layer has a second lattice constant. The first fin structure further includes a first channel layer over the buffer layer. The lattice constant difference between the first channel layer and the buffer layer is smaller than the lattice constant difference between the first channel layer and the semiconductor layer. The first channel layer has a third lattice constant, and the third lattice constant is greater than the second lattice constant, and the first lattice constant is greater than the second lattice constant. The semiconductor device further includes a first gate structure covering a portion of the first fin structure and a first source/drain structure adjacent to the first gate structure. The second fin structure includes a second channel layer over the semiconductor substrate. The second channel layer has a fourth lattice constant, and the fourth lattice constant is less than the first lattice constant. The semiconductor device also includes a second gate structure covering a portion of the second fin structure, and a second source/drain structure adjacent to the second gate structure.

In accordance with some embodiments, a semiconductor device is provided. The semiconductor device includes a semiconductor substrate having a P-type metal-oxide-semiconductor region (PMOS region) and an N-type metal-oxide-semiconductor region (NMOS region), and the semiconductor substrate has a first lattice constant. The semiconductor device also includes a semiconductor layer over the PMOS region of the semiconductor substrate, and a carbon-containing buffer layer over the semiconductor layer. The carbon-containing buffer layer has a second lattice constant. The semiconductor device further includes a first channel layer over the carbon-containing buffer layer, and the first channel layer and the carbon-containing buffer layer contains a same element with an atomic mass greater than that of carbon. The first channel layer has a third lattice constant, and the third lattice constant is greater than the second lattice constant, and the first lattice constant is greater than the second lattice constant. The semiconductor device further includes a first gate structure over the first channel layer, and two first source/drain structures at opposite sides of the first gate structure. The second fin structure includes a second channel layer over the NMOS region of the semiconductor substrate. The second channel layer has a fourth lattice constant, and the fourth lattice constant is less than the first lattice constant. The semiconductor device further includes a second gate structure over the second channel layer, and two second source/drain structures at opposite sides of the second gate structure.

In accordance with some embodiments, a method for forming a semiconductor device is provided. The method includes providing or receiving a semiconductor substrate with a first lattice constant. The semiconductor substrate has a P-type metal-oxide-semiconductor region (PMOS region) and an N-type metal-oxide-semiconductor region (NMOS region). The method also includes forming a semiconductor layer over the PMOS region of the semiconductor substrate, forming a first buffer material layer over the semiconductor layer, and forming a first channel layer over the first buffer material layer. The first channel layer includes a first element and a second element, and an atomic mass of the second element is greater than an atomic mass of the first element. The method further includes diffusing a portion of the first channel layer into the first buffer material layer to form a second buffer material layer such that the second buffer material layer contains an element which is the same as the second element. The second buffer material layer has a second lattice constant, and the first channel layer has a third lattice constant. The third lattice constant is greater than the second lattice constant, and the first lattice constant is greater than the second lattice constant. The method further includes forming a second channel layer over the NMOS region of the semiconductor substrate. The second channel layer has a fourth lattice constant, and the fourth lattice constant is less than the first lattice constant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate having a P-type metal-oxide-semiconductor region (PMOS region) and an N-type metal-oxide-semiconductor region (NMOS region), wherein the semiconductor substrate has a first lattice constant;
a first fin structure over the PMOS region of the semiconductor substrate and a second fin structure over the NMOS region of the semiconductor substrate, wherein the first fin structure comprises:
a semiconductor layer;

a buffer layer over the semiconductor layer, wherein the buffer layer has a second lattice constant; and a first channel layer over the buffer layer, wherein a lattice constant difference between the first channel layer and the buffer layer is smaller than a lattice constant difference between the first channel layer and the semiconductor layer, wherein the first channel layer has a third lattice constant, wherein the third lattice constant is greater than the second lattice constant, and the first lattice constant is greater than the second lattice constant;

a first gate structure covering a portion of the first fin structure;

a first source/drain structure adjacent to the first gate structure;

wherein the second fin structure comprises:
a second channel layer over the semiconductor substrate, wherein the second channel layer has a fourth lattice constant, and the fourth lattice constant is less than the first lattice constant;
a second gate structure covering a portion of the second fin structure; and
a second source/drain structure adjacent to the second gate structure.

2. The semiconductor device as claimed in claim 1, wherein the buffer layer contains silicon, germanium, and carbon.

3. The semiconductor device as claimed in claim 2, wherein the buffer layer comprises at least two portions with different carbon concentrations.

4. The semiconductor device as claimed in claim 2, wherein an atomic concentration of germanium in the buffer layer decreases along a direction from the first channel layer towards the semiconductor layer.

5. The semiconductor device as claimed in claim 1, wherein the semiconductor layer is substantially made of silicon.

6. The semiconductor device as claimed in claim 1, wherein the semiconductor substrate comprises a base portion and a protrusion portion over the base portion, wherein the semiconductor layer is over the protrusion portion.

7. The semiconductor device as claimed in claim 1, further comprising:
a cap layer over the first channel layer.

8. The semiconductor device as claimed in claim 1, wherein the first source/drain structure is spaced apart from the buffer layer.

9. A semiconductor device, comprising:
a semiconductor substrate having a P-type metal-oxide-semiconductor region (PMOS region) and an N-type metal-oxide-semiconductor region (NMOS region), wherein the semiconductor substrate has a first lattice constant;
a semiconductor layer over the PMOS region of the semiconductor substrate;
a carbon-containing buffer layer over the semiconductor layer, wherein the carbon-containing buffer layer has a second lattice constant;
a first channel layer over the carbon-containing buffer layer, wherein the first channel layer and the carbon-containing buffer layer contains a same element with an atomic mass greater than that of carbon, wherein the first channel layer has a third lattice constant, wherein the third lattice constant is greater than the second lattice constant, and the first lattice constant is greater than the second lattice constant;
a first gate structure over the first channel layer;

two first source/drain structures at opposite sides of the first gate structure;
wherein the second fin structure comprises:
a second channel layer over the NMOS region of the semiconductor substrate, wherein the second channel layer has a fourth lattice constant, and the fourth lattice constant is less than the first lattice constant;
a second gate structure over the second channel layer;
two second source/drain structures at opposite sides of the second gate structure.

10. The semiconductor device as claimed in claim 9, wherein the carbon-containing buffer layer has an atomic concentration of carbon in a range from about 0.5 atom % to about 5 atom %.

11. The semiconductor device as claimed in claim 9, wherein the first channel layer is a silicon germanium channel layer and comprises at least two portions with different germanium concentrations.

12. The semiconductor device as claimed in claim 11, wherein the first channel layer has a first portion and a second portion between the first portion and the carbon-containing buffer layer, wherein the first portion has an atomic concentration of germanium greater than that of the second portion.

13. The semiconductor device as claimed in claim 12, wherein the first portion is adjacent to the second portion, and the second portion is thicker than the first portion.

14. The semiconductor device as claimed in claim 9, further comprising:
a silicon cap layer over the first channel layer.

15. The semiconductor device as claimed in claim 9, wherein the semiconductor substrate comprises a base portion and a protrusion portion over the base portion, wherein the base portion is wider than the protrusion portion, and the semiconductor layer is over the protrusion portion.

16. The semiconductor device as claimed in claim 15, wherein the protrusion portion, the semiconductor layer, the carbon-containing buffer layer and the first channel layer together form a fin structure.

17. A semiconductor device, comprising:
a semiconductor substrate having a P-type metal-oxide-semiconductor region (PMOS region) and an N-type metal-oxide-semiconductor region (NMOS region);
a first fin structure over the PMOS region of the semiconductor substrate and a second fin structure over the NMOS region of the semiconductor substrate, wherein the first fin structure comprises:
a semiconductor layer;
a buffer layer over the semiconductor layer; and
a first channel layer over the buffer layer, wherein the first channel layer has a first portion and a second portion between the first portion and the buffer layer, wherein the first portion and the second portion of the first channel layer have different germanium concentrations;
a first gate structure covering a portion of the first fin structure;
a first source/drain structure adjacent to the first gate structure;
wherein the second fin structure comprises:
a second channel layer over the semiconductor substrate;
a second gate structure covering a portion of the second fin structure; and
a second source/drain structure adjacent to the second gate structure.

18. The semiconductor device as claimed in claim 17, wherein the buffer layer contains silicon, germanium, and carbon.

19. The semiconductor device as claimed in claim 18, wherein the buffer layer comprises at least two portions with different carbon concentrations.

20. The semiconductor device as claimed in claim 18, wherein an atomic concentration of germanium in the buffer layer decreases along a direction from the first channel layer towards the semiconductor layer.

* * * * *